United States Patent
Tegen et al.

(10) Patent No.: US 9,230,870 B2
(45) Date of Patent: Jan. 5, 2016

(54) INTEGRATED TEST CIRCUIT AND METHOD FOR MANUFACTURING AN INTEGRATED TEST CIRCUIT

(71) Applicant: Infineon Technologies AG, Neubiberg (DE)

(72) Inventors: Stefan Tegen, Dresden (DE); Marko Lemke, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 137 days.

(21) Appl. No.: 13/753,636

(22) Filed: Jan. 30, 2013

(65) Prior Publication Data

US 2014/0209904 A1    Jul. 31, 2014

(51) Int. Cl.
| | |
|---|---|
| H01L 29/10 | (2006.01) |
| H01L 21/00 | (2006.01) |
| H01L 21/66 | (2006.01) |

(52) U.S. Cl.
CPC ............... *H01L 22/30* (2013.01); *H01L 22/14* (2013.01); *H01L 22/34* (2013.01); *H01L 2924/0002* (2013.01)

(58) Field of Classification Search
CPC ..................................................... H01L 22/30
USPC .............................................. 257/48; 438/11
See application file for complete search history.

(56) References Cited

U.S. PATENT DOCUMENTS

| | | | |
|---|---|---|---|
| 6,981,090 B1 | 12/2005 | Kutz et al. | |
| 7,312,625 B1 * | 12/2007 | Paak et al. | 324/762.02 |
| 2005/0046439 A1 * | 3/2005 | Yu | 324/770 |
| 2005/0051765 A1 * | 3/2005 | Rosskopf et al. | 257/12 |
| 2008/0278182 A1 * | 11/2008 | Agarwal et al. | 324/713 |
| 2010/0090715 A1 * | 4/2010 | Chang et al. | 324/754 |
| 2010/0318313 A1 * | 12/2010 | Agarwal et al. | 702/117 |
| 2010/0327876 A1 * | 12/2010 | Tseng | 324/537 |
| 2013/0221353 A1 * | 8/2013 | Yang et al. | 257/48 |

FOREIGN PATENT DOCUMENTS

JP          2011204708 A     * 10/2011

* cited by examiner

*Primary Examiner* — Matthew Landau
*Assistant Examiner* — Igwe U Anya

(57) ABSTRACT

An integrated test circuit, including a plurality of test structure elements, wherein each test structure element includes at least a supply line and a test line; a plurality of select transistors, wherein each select transistor is assigned to one corresponding test structure element, and wherein each select transistor includes a first controlled region, a second controlled region, and a control region, wherein the second controlled region of each select transistor is respectively connected to the supply line of the corresponding test structure element, so that each select transistor is unambiguously assigned to the corresponding test structure element; and a plurality of contact pads, connected to respective first controlled regions and control regions of the plurality of select transistors, such that each test structure element of the plurality of test structure elements can be individually addressed by the plurality of contact pads.

24 Claims, 12 Drawing Sheets

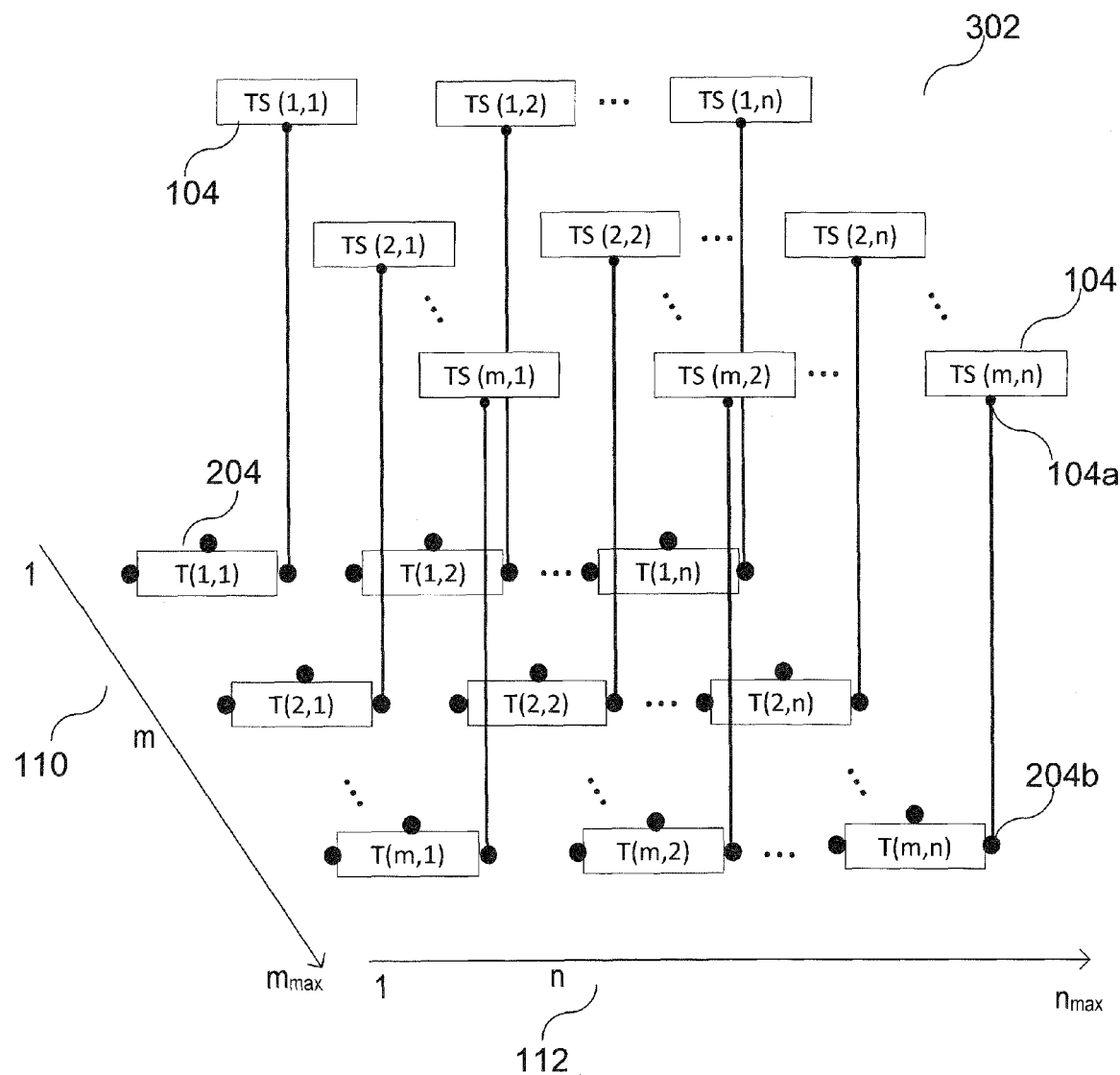

610 — providing a plurality of test structure elements, wherein each test structure element of the plurality of test structure elements comprises at least one supply line and at least one test line

620 — providing a plurality of select transistors, wherein each select transistor of the plurality of select transistors is assigned to one corresponding test structure element, and wherein each select transistor comprises a first controlled region, a second controlled region, and a control region, wherein the second controlled region of each select transistor is respectively electrically connected to the supply line of the corresponding test structure element, so that each select transistor is unambiguous assigned to the corresponding test structure element

630 — providing a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads of the plurality of contact pads and each test structure element can be individually addressed by the plurality of contact pads

INTEGRATED TEST CIRCUIT AND METHOD FOR MANUFACTURING AN INTEGRATED TEST CIRCUIT

TECHNICAL FIELD

Various embodiments generally relate to an integated test circuit and to a method for manufacturing an integrated test circuit.

BACKGROUND

A general task in chip fabrication and in the manufacturing of an integrated circuit may be the scaling of the included structure elements to a smaller feature size. Reducing the feature size of the structure elements of a chip may lead to a reduced reproducibility, since the error tolerance during fabrication may become smaller, due to the small dimensions of the structure elements. As a direct result of the scaling, the number of structure elements on a single chip or a single die may increase. As a result, testing a structure element on a chip, the functionality of an integrated circuit, as well as finding a critical process parameter and the critical dimension of a structure element may become important, and hence, a test structure may be used, which may be arranged within an integrated test circuit or within a chip, e.g. a test chip. Since the number of test structure elements included in an integrated test circuit may be very large, e.g. larger than 100 or larger than 1000 or even larger, providing a likewise large number of contact pads for electrically contacting the test structure elements may be a problem, since typical test devices may only have a limited number of pins which can be connected to the contact pads. This limitation may be mainly caused by the use of large space consuming structures, which may be necessary for connecting a large number of pins with the corresponding contact pads compared to the small size of a test structure element within an integrated test circuit. The number of desired test structures (or test structure elements) may increase with increasing number of metallization layers included in an integrated circuit. Therefore, problems may occur regarding the electrically contacting of the individual test structure elements. Despite the fact that contact pads may be provided for every test structure element, the number of pins (e.g. spring-loaded pins, e.g. pogo pins) provided in a test device (e.g. provided in a so-called bed of nails tester) may be limited. Further, also the necessary space on a wafer (e.g. in a kerf region of a wafer) to form a large number of contact pads for a test structure may be limited.

SUMMARY

In one or more embodiments, an integrated test circuit is provided, which may include a plurality of test structure elements, wherein each test structure element includes at least a supply line and a test line; a plurality of select transistors, wherein each select transistor is assigned to one corresponding test structure element, and wherein each select transistor includes a first controlled region, a second controlled region, and a control region, wherein the second controlled region of each select transistor is respectively connected to the supply line of the corresponding test structure element, so that each select transistor is unambiguously assigned to the corresponding test structure element; and a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads, such that each select transistor can be individually addressed by the plurality of contact pads.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows an arrangement of a plurality of test structure elements and a plurality of select transistors, wherein the select transistors are electrically connected to the test structure elements, according to various embodiments;

FIG. 6 and FIG. 7 show respectively a flow diagram for a method for manufacturing an integrated test circuit, according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The word "electrically connected" or "connected" used with regards to two structure elements within an integrated test circuit being "connected" may be used herein to mean that the connection or the electrical connection may form a conductive path from the one structure element to the other structure element.

Figure 1A:
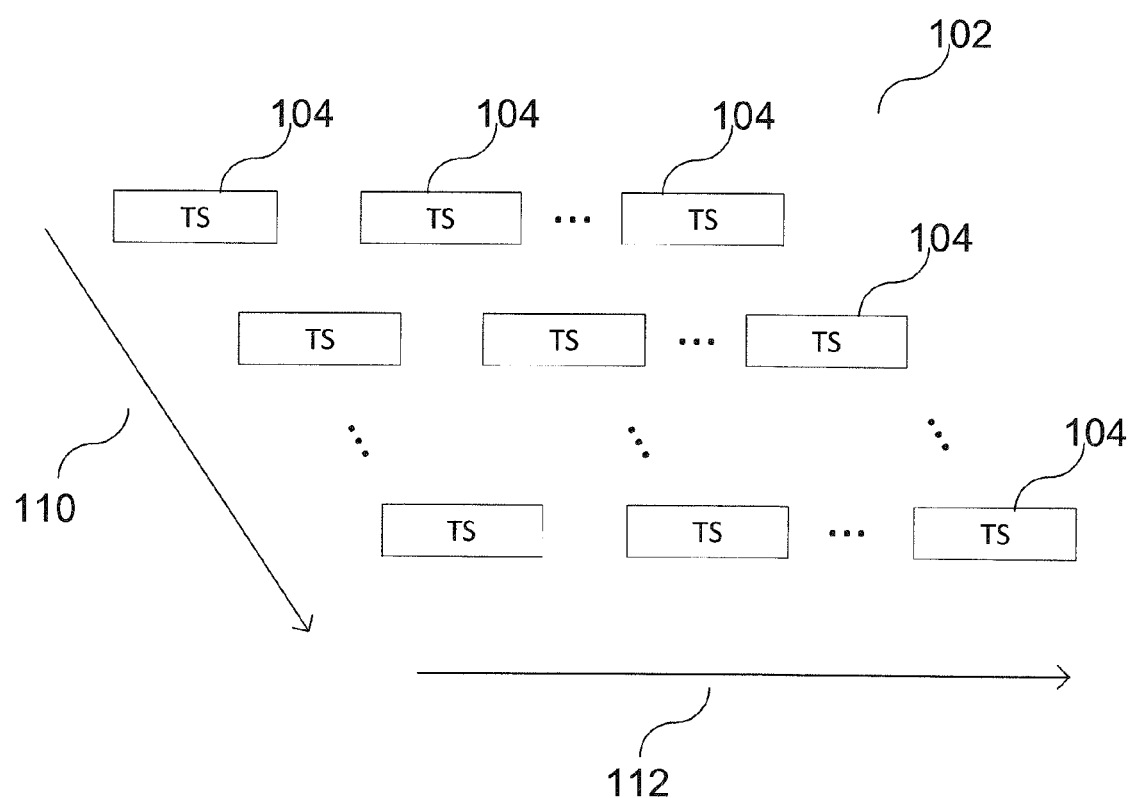
FIG. 1A shows an arrangement of test structure elements, according to various embodiments.

For the development and fabrication of semiconductor devices test structures may be included to investigate technical parameters and error sources of a chip (or of an integrated circuit or of a die or the like). A test structure according to various embodiments including a plurality of test structure elements is illustratively shown in FIG. 1A. The test structure 102 may include a plurality of test structure elements 104 (also labeled with TS). According to various embodiments, the test structure elements 104 (TS) may include at least one of a via, a contact chain, a snake and a comb line, or the like. As shown in FIG. 1A, the plurality of test structure elements 104 may be arranged in an arrangement (e.g. a two-dimensional arrangement), wherein one direction (or dimension) of this arrangement may be a first direction 110 and another direction (or dimension) may be a second direction 112, e.g. running perpendicular (or in angle) to the first direction 110. Since a large number of test structure elements 104 may be included in test structure 102, according to various embodiments, the number of test structure elements 104 shown in FIG. 1A is reduced to a small number of test structure elements 104 for illustrating the principles of various embodiments, wherein it is indicated in FIG. 1A that in general, an arbitrary number of test structure elements 104 may be provided in each direction, e.g. several tens, hundreds, thousands or even more test structure elements 104. According to various embodiments, a specific arrangement of the test structure elements 104 may differ from the arrangement as shown in FIG. 1A, since the specific location of individual test structure elements 104 may not have a significant influence on the functionality of an integrated test circuit.

According to various embodiments, a test structure (e.g. the test structure 102 including a plurality of test structure elements 104 (TS), as shown in FIG. 1A), may be at least part of an integrated circuit or an integrated test circuit. According to various embodiments, a test structure (e.g. test structure 102) may be formed in a kerf region of a wafer. A test structure (e.g. test structure 102) may be at least part of a chip, e.g. a test chip. According to various embodiments, a test structure (e.g. test structure 102) may include at least one type of test structure elements (e.g. a via, e.g. a contact chain, e.g. a snake, e.g. a comb line). According to various embodiments, a test structure (e.g. test structure 102) may include various types of test structure elements.

According to various embodiments, a test structure element may be configured for testing and/or detecting at least one of the following: a shortcut, an open circuit, the contact integrity, the sheet resistance, and the contact resistance. According to various embodiments, a test structure element, e.g. a comb line, may be used for detecting a shortcut (e.g. a shortcut between conductive paths within a metallization layer, e.g. a shortcut between conductive paths between different metallization layers). According to various embodiments, a test structure element, e.g. a meander structure (a so-called snake), may be used for detecting an open circuit (or measuring the resistance of a structure element). According to various embodiments, a test structure element, e.g. contact chain, may be used for detecting the integrity of a contact (e.g. for testing the resistance between different metallization layers). According to various embodiments, a test structure element, e.g. a 4-point probe structure or a Van der Pauw structure, may be used for measuring the sheet resistance of a structure element. According to various embodiments, a test structure element, e.g. a Kelvin structure, may be used for measuring the contact resistance. According to various embodiments, a test structure element for measuring a resistance, e.g. the sheet resistance, may have more than one test line. According to various embodiments, a test structure element may be configured to characterize a transistor and/or a diode. According to various embodiments, a test structure element may be configured to characterize a single electronic component (e.g. a capacitor). According to various embodiments, a test structure may include test structure elements having various feature sizes, e.g. test structure elements having the nominal feature size (e.g. a nominal width, which may be commonly used), and test structure elements having a feature size which is smaller or larger than the nominal feature size, for testing the tolerance of a process parameter (e.g. for determining a process window).

According to various embodiments, a test structure element may include a substructure, wherein the substructure may include a plurality of substructure test elements, e.g. at least one of a via, a contact chain, a snake, and a comb line. That is, according to various embodiments, a test structure element may include a plurality of at least one of vias, contact chains, snakes, and comb lines.

Figure 1B:
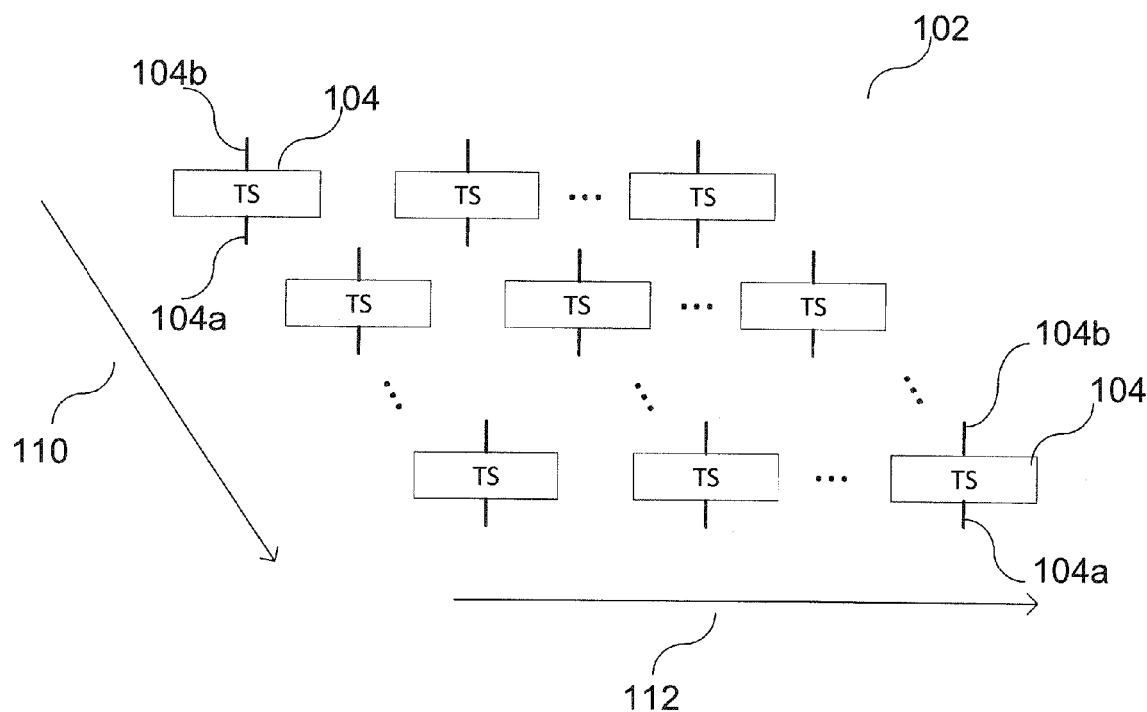
FIG. 1B shows an arrangement of test structure elements, wherein each test structure element includes a supply line and a test line, according to various embodiments.

FIG. 1B shows a test structure 102 including an arrangement (e.g. two-dimensional arrangement) of test structure elements 104 (TS), wherein each test structure element 104 may include at least a supply line 104a and a test line 104b. A signal (e.g. an input signal, e.g. a current, e.g. a test signal) may be transferred via the supply line 104a to the test structure element 104. According to various embodiments, a signal may include a direct current or an alternating current (accordingly a direct voltage or an alternating voltage). According to various embodiments, the test line 104b may transfer an output signal from the test structure element 104 triggered by the signal (e.g. by an input signal, e.g. by a current, e.g. by a test signal).

According to various embodiments, the test lines of each test structure element of the plurality of test structure elements may be connected to a common contact pad (e.g. all test lines of all test structure elements may be connected to a common contact pad). According to various embodiments, if each test structure element of the plurality of test structure elements includes a plurality of test lines (e.g. three test lines or four test lines, e.g. for measuring a resistance in 4-point probe geometry), more than one common contact pad may be provided for connecting the test lines of the plurality of test lines with corresponding common contact pads (e.g. the three or four respective test lines of each test structure element of the plurality of test structure elements may be respectively connected to a corresponding common contact pad). According to various embodiments, each test structure element of the plurality of test structure elements may have a first test line, a second test line, and a third test line, wherein the first test lines of all of the test structure elements may be connected to a corresponding first common contact pad, wherein the second test lines of all of the test structure elements may be connected to a corresponding second common contact pad, and wherein the third test lines of all of the test structure elements may be connected to a corresponding third common contact pad (in analogy, each test structure element may have two, four, five or even more test lines, wherein the test lines of all of the test structure elements may be connected to a respective number of common contact pads, according to various embodiments).

Figure 1C:
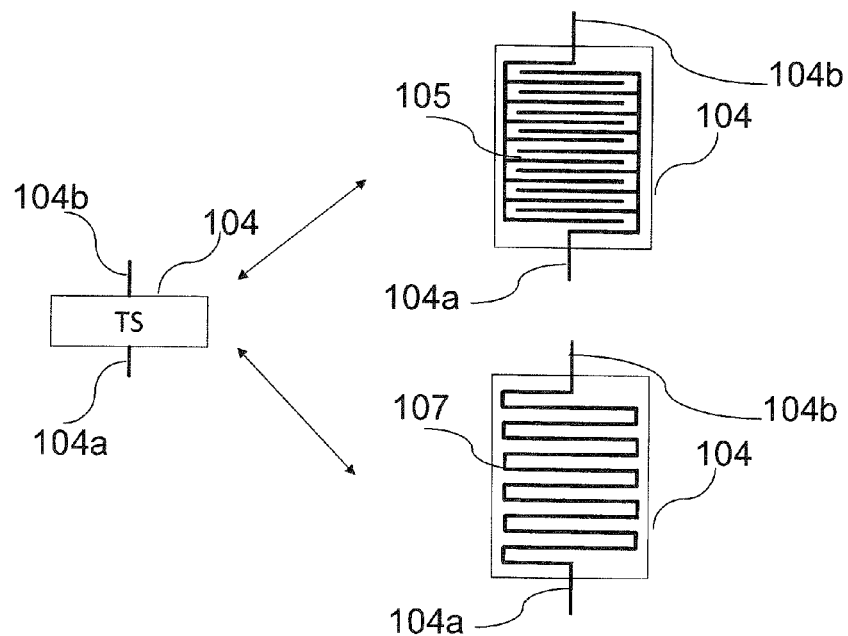
FIG. 1C shows exemplarily a detailed schematic illustration of a test structure element, according to various embodiments.

FIG. 1C exemplarily shows a detailed schematic illustration of a test structure element 104, according to various embodiments. According to various embodiments, test structure element 104 may include a comb line (or a comb structure) 105, which may be electrically connected to supply line 104a and test line 104b. According to various embodiments, the test structure element 104 having the comb line 105 may be used for detecting shortcuts. According to various embodiments, test structure element 104 may include a snake (or a meander structure) 107, which may be electrically connected to supply line 104a and test line 104b. According to various embodiments, the test structure element 104 having the snake 107 may be used for detecting open circuits and/or measuring the resistance.

Figure 1D:
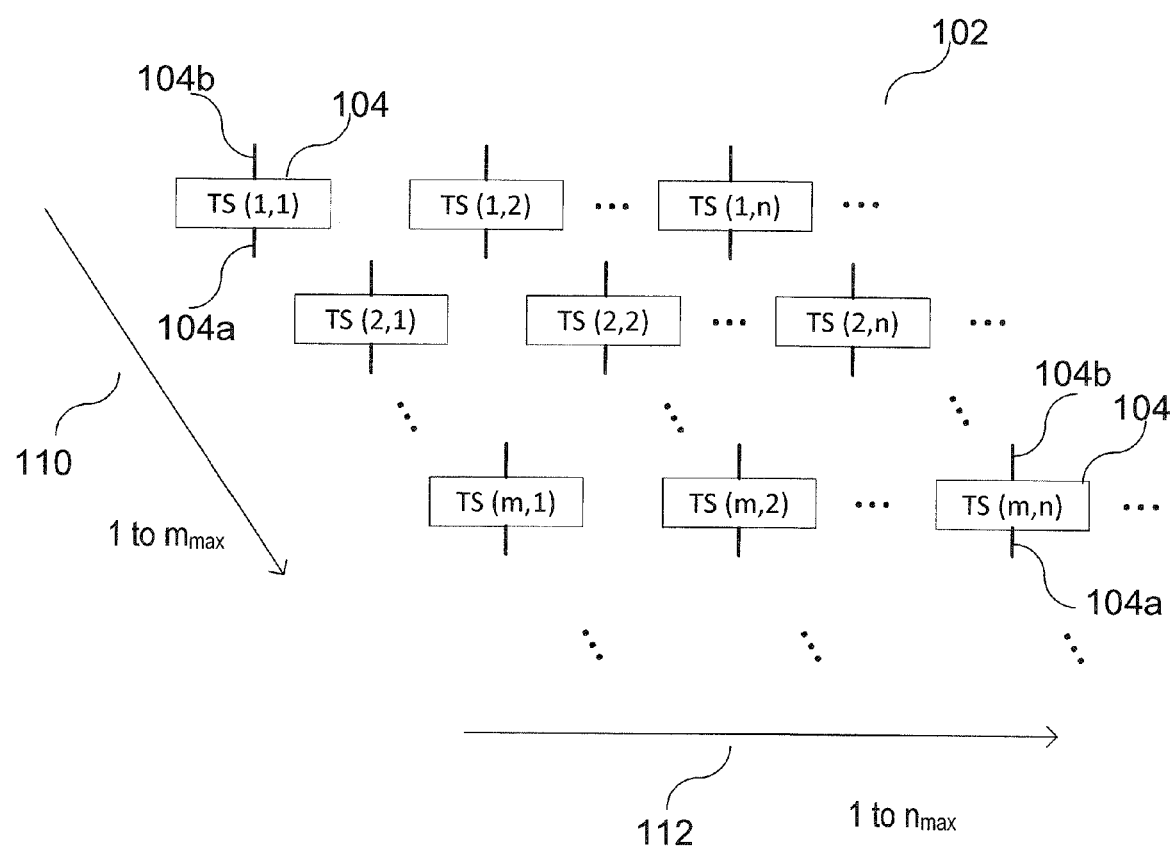
FIG. 1D shows an arrangement of test structure elements, wherein each test structure element is identified by a tuple (m, n), according to various embodiments.

In the following, a test structure element 104 included in test structure 102 may be identified (indexed or labeled) as illustrated in FIG. 1D. According to various embodiments, without loss of generality, the test structure elements 104 along the first direction 110 may be at least partially identified by a pointer variable m and the test structure elements 104 along the second direction 112 may be at least partially identified by a pointer variable n. The pointer variables m and n are utilized in the following as tuples (ordered lists of elements), e.g. in one case as ordered list of pairs (m, n), wherein m and n are natural numbers respectively and, according to various embodiments, m may range from 1 to $m_{max}$ and n may range from 1 to $n_{max}$, wherein $m_{max}$ and $n_{max}$ may be larger than one respectively ($m_{max}>1$ and $n_{max}>1$). According to various embodiments, the tuple (m, n) may identify each single test structure element TS(m, n) of the plurality of test structure elements TS(1 to $m_{max}$, 1 to $n_{max}$), so that a total number of $m_{max}$ times $n_{max}$ test structure elements may be unambiguously identified within the arrangement of test structure elements, as shown in FIG. 1D (or within an arbitrary arrangement of test structure elements, not shown in the figures). According to various embodiments, $m_{max}$ and $n_{max}$ may range from 2 to 100 respectively.

According to various embodiments, m may range from 1 to $m_{max}$ and n may range from 1 to $n_{max}$, wherein $m_{max}$ may be larger than two and $n_{max}$ may be larger than one ($m_{max}>2$ and $n_{max}>1$). According to various embodiments, m may range from 1 to $m_{max}$ and n may range from 1 to $n_{max}$, wherein $m_{max}$ may be larger than one and $n_{max}$ may be larger than two ($m_{max}>1$ and $n_{max}>2$). According to various embodiments, m may range from 1 to $m_{max}$ and n may range from 1 to $n_{max}$, wherein $m_{max}$ may be two and $n_{max}$ may be larger than two ($m_{max}=2$ and $n_{max}>2$), e.g. $m_{max}$ may be two and $n_{max}$ may be much larger than two ($m_{max}=2$ and $n_{max}>10$). According to various embodiments, m may range from 1 to $m_{max}$ and n may range from 1 to $n_{max}$, wherein $m_{max}$ may be larger than two and $n_{max}$ may be two ($m_{max}>2$ and $n_{max}=2$), e.g. $m_{max}$ may be much larger than two and $n_{max}$ may be two ($m_{max}>10$ and $n_{max}=2$). According to various embodiments, m may range from 1 to $m_{max}$ and n may range from 1 to $n_{max}$, wherein $m_{max}$ may be larger than two and $n_{max}$ may be larger than two ($m_{max}>2$ and $n_{max}>2$).

It has to be noted, that this is only one method for identifying the test structure elements individually (similar to a matrix) to describe the electrical connections within an integrated test circuit, wherein the electrical functionality of the test structure may not depend on the specific method for identifying or labeling the test structure elements. Further, this method of identifying or labeling structure elements within an integrated test circuit is used in the following to identify (to index or to label) other structure elements, as for example select transistors T, pre-select transistors PT, and contact pads CP. Further, according to various embodiments, the two-dimensional or three-dimensional arrangements of structure elements, as for example select transistors, pre-select transistors and contact pads, shown herein may be regarded as logical arrangements, wherein the actual arrangement of the structure elements may be realized as it is desired for the respective integrated circuit.

In the following, according to various embodiments, a set or subset of test structure elements 104 may be identified (or may be referred to in the description) by using the pointer variables m and n, wherein the tuple TS(m, n) may identify one arbitrary test structure element 104 (since m and n represent a number in the range of 1 to $m_{max}$ and 1 to $n_{max}$ respectively), the tuple TS(1, 1) as for example may identify one specific test structure element 104 (e.g. the upper left test structure element 104 of the test structure 102 shown in FIG. 1D), the tuple TS(1 to $m_{max}$, 1 to $n_{max}$) may identify the whole set of test structure elements 104 (as shown in FIG. 1D), the tuple TS(1 to $m_{max}$, n) may identify a plurality of test structure elements 104 along the first direction 110 (since m may range from 1 to $m_{max}$ and n represents a number in the range of 1 to $n_{max}$), and the tuple TS(m, 1 to $n_{max}$) may identify a plurality of test structure elements 104 along the second direction 112 (since n may range from 1 to $n_{max}$ and m represents a number in the range of 1 to $m_{max}$). It has to be noted, that the tuple TS(1, 2) refers to another test structure element 104 than the tuple TS(2, 1), since the notation as tuple refers to a set of ordered numbers.

Figure 2A:
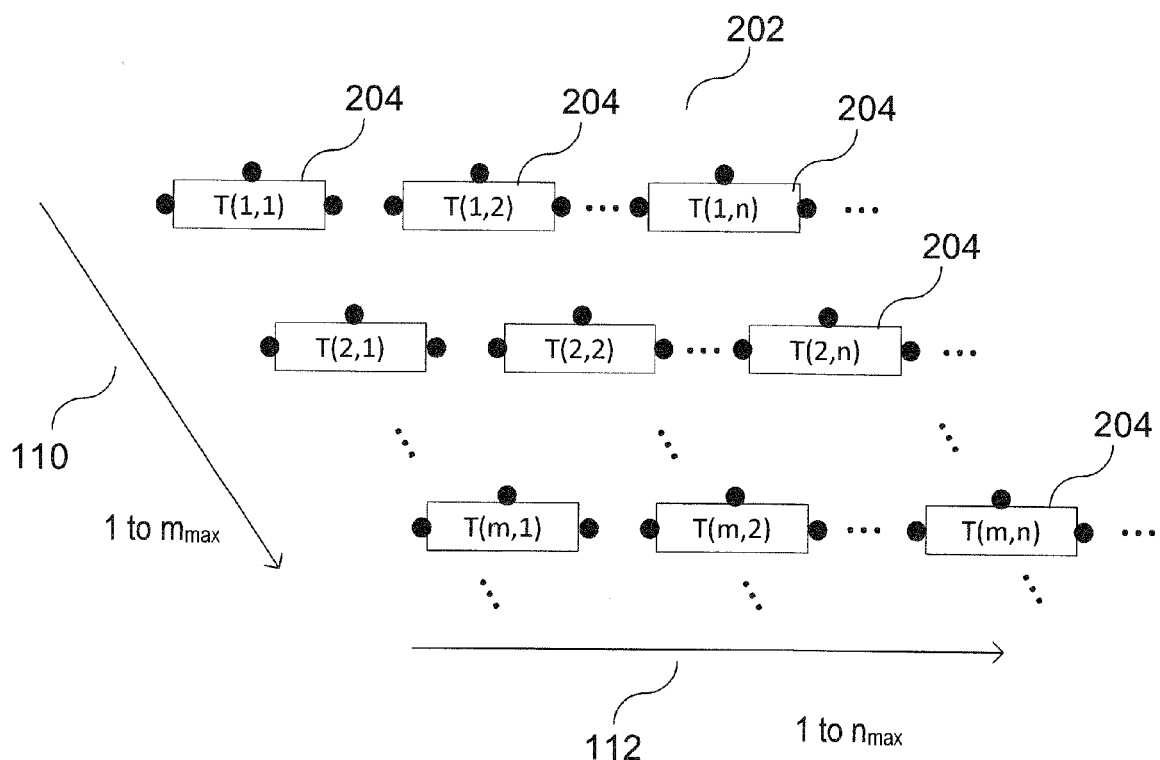
FIG. 2A shows an arrangement of select transistors, wherein each select transistor can be unambiguously identified using a tuple (m, n), according to various embodiments.

In analogy, according to various embodiments, a set or subset of select transistors 204 may be identified (or may be referred to in the description) by using the pointer variables m and n, wherein the tuple T(m, n) may identify one arbitrary select transistor (since m and n may represent a number in the range of 1 to $m_{max}$ and 1 to $n_{max}$ respectively), the tuple T(1, 1) for example may identify one specific select transistor (e.g. the upper left select transistor 204 in the select transistor arrangement 202 shown in FIG. 2A further described below), the tuple T(1 to $m_{max}$, 1 to $n_{max}$) may identify the whole set of select transistors (as shown in FIG. 2A), the tuple T(1 to $m_{max}$, n) may identify a plurality of select transistors along the first direction 110 (since m may range from 1 to $m_{max}$ and n represents a number in the range of 1 to $n_{max}$), and the tuple T(m, 1 to $n_{max}$) may identify a plurality of select transistors along the second direction 112 (since n may range from 1 to $n_{max}$ and m represents a number in the range of 1 to $m_{max}$). It should be noted, that the tuple T(1, 2) refers to another select transistor than the tuple T(2, 1), since the notation as tuple refers to a set of ordered numbers.

As shown in FIG. 2A, according to various embodiments, a plurality of select transistors 204 (T(1 to $m_{max}$, 1 to $n_{max}$))

may be arranged in a select transistor arrangement 202 (e.g. in a two-dimensional select transistor arrangement 202), in analogy to the arrangement (e.g. two-dimensional arrangement) of the test structure elements 104 in test structure 102. According to various embodiments, each select transistor of the plurality of select transistors 204 may unambiguously be assigned to one test structure element 104, e.g. select transistor T(1, 1) may be assigned to test structure element TS(1, 1) and in analogy, each select transistor T(m, n) of the select transistors T(1 to $m_{max}$, 1 to $n_{max}$) may be unambiguously assigned to the corresponding test structure element TS(m, n) of the plurality of test structure elements TS(1 to $m_{max}$, 1 to $n_{max}$). According to various embodiments, the total number of test structure elements 104 may be the same as the total number of select transistors 204 (e.g. $m_{max}$ times $n_{max}$ as shown in FIG. 1D and FIG. 2A). According to various embodiments, the total number of test structure elements 104 may be smaller or larger as the total number of select transistors 204 (not shown in figures).

Figure 2B:
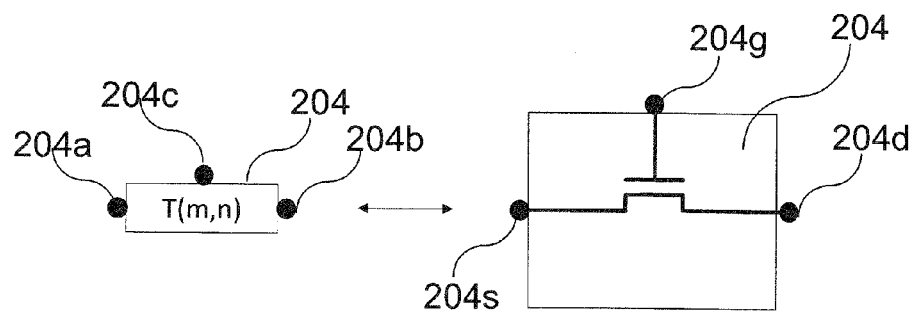
FIG. 2B shows a detailed schematic illustration of a select transistor, according to various embodiments.

FIG. 2B shows a detailed schematic illustration of a select transistor 204, T(m, n), according to various embodiments. According to various embodiments, the select transistor 204 may include a first controlled region 204a, a second controlled region 204b, and a control region 204c. According to various embodiments, the select transistor 204 may have a first source/drain region, e.g. a source region, 204s (which may correspond to a first controlled region), a second source/drain region, e.g. a drain region, 204d (which may correspond to a second controlled region), and a control gate 204g (which may correspond to a control region), as shown in the right half of FIG. 2B. According to various embodiments, the select transistor 204 may be a field effect transistor, as shown. According to various embodiments, the select transistor 204 may be a bipolar transistor, wherein the bipolar transistor may have a first emitter/collector region, e.g. an emitter region, (which may correspond to a first controlled region), a second emitter/collector region, e.g. a collector region, (which may correspond to a second controlled region), and a base region (which may correspond to a control region).

According to various embodiments, all select transistors T(1 to $m_{max}$, 1 to $n_{max}$) may be of the same type. According to various embodiments, at least one select transistor of the plurality of select transistors may be of a different type than the other select transistors. According to various embodiments, the select transistor may serve to transfer a signal (e.g. a current, e.g. a test signal) to the corresponding test structure element. According to various embodiments, the second controlled region of at least one select transistor of the plurality of select transistors may be connected to the supply line of the respective corresponding test structure element (e.g. the second controlled region of select transistor T(1, 1) may be connected to the supply line of test structure element TS(1, 1), and in analogy each second controlled region of a select transistor T(m, n) of the plurality of select transistors T(1 to $m_{max}$, 1 to $n_{max}$) may be connected to the supply line of the unambiguously assigned corresponding test structure element TS(m, n) of the plurality of test structure elements TS(1 to $m_{max}$, 1 to $n_{max}$).

Further, according to various embodiments, electrically connecting the test structure elements with the corresponding select transistor generates a physical assignment, which may at least partially provide the electrical functionality of an integrated test circuit. According to various embodiments, the select transistors may be located on a wafer surface below the test structure. According to various embodiments, at least one select transistor of the plurality of select transistors may be located in the kerf region of a wafer. According to various embodiments, the select transistors may be at least part of a chip, e.g. a test chip. According to various embodiments, the select transistors may be configured to realize a high current flow (e.g. a current up to 1 A, e.g. a current in the range from about 1 mA to about 1 A, e.g. a current of about 10 mA).

It should be noted, that only a physical connection (e.g. an electrical connection, which means an electrically conductive connection) may influence the functionality of the test structure, wherein the description using tuples may only serve as an auxiliary method for describing the specific assignments easily. According to various embodiments, the arrangement of test structure elements and select transistors may be arbitrary, as long as the electrical connection between the select transistors and the test structure elements generates a clear assignment of respectively one select transistor to respectively one test structure element.

FIG. 3 shows an arrangement 302 including a plurality of test structure elements 104 and a plurality of select transistors 204 (e.g. including test structure 102 and select transistor arrangement 202, as described before), according to various embodiments, wherein a second controlled region 204b of a select transistor 204 may be electrically connected to a supply line 104a of an unambiguously assigned test structure element 104 (e.g. second controlled region 204b of select transistor T(1, 1) may be electrically connected to supply line 104a of test structure element TS(1, 1), or second controlled region 204b of select transistor T(2, 1) may be connected to supply line 104a of test structure element TS(2, 1), as shown). According to various embodiments, select transistor T(m, n) may be electrically connected to test structure element TS(m, n), wherein the second controlled region 204b of select transistor T(m, n) may be electrically connected to the supply line 104a of the unambiguously assigned test structure element TS(m, n).

According to various embodiments, if a test structure element is unambiguously assigned to a select transistor, the test structure element can be addressed by addressing the select transistor.

According to various embodiments, each select transistor 204, T(m, n), of the plurality of select transistors 204 may be connected to a contact pad of a set of contact pads via the first controlled region 204a and the control region 204c respectively. According to various embodiments, a first connection between the select transistor 204 and the corresponding contact pad may provide a supply current for the select transistor 204 and a second connection between the select transistor 204 and the corresponding contact pad may be required for controlling the select transistor 204. According to various embodiments, each control region 204c of a select transistor 204 (e.g. control gate 204g of select transistor 204 shown in the right half of FIG. 2B) may be electrically connected to a corresponding contact pad. According to various embodiments, each first controlled region 204a of a select transistor 204 (e.g. first source/drain region 204s of select transistor 204 shown in the right half of FIG. 2B) may be electrically connected to a corresponding contact pad.

Figure 4A:
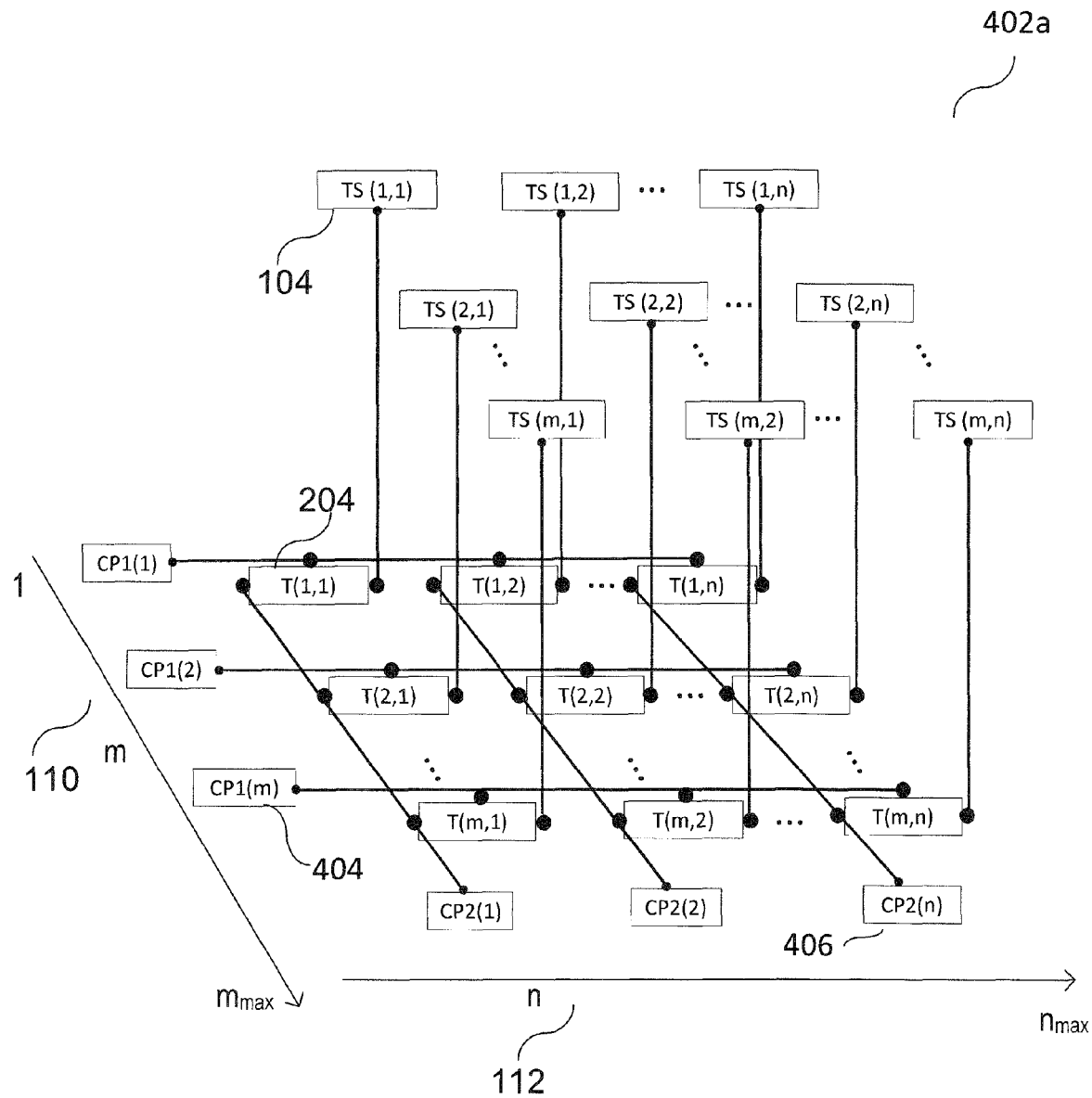
FIG. 4A shows an arrangement of a plurality of test structure elements, a plurality of select transistors, and a plurality of contact pads, wherein each test structure element may be individually addressed by the plurality of contact pads via an arrangement of select transistors, according to various embodiments.

As shown in FIG. 4A, according to various embodiments, a test structure arrangement 402a (e.g. an integrated test circuit) may include a plurality of test structure elements 104, a plurality of select transistors 204, and a plurality of contact pads 404, 406 (e.g. contact pads CP1(1 to $m_{max}$) and contact pads CP2(1 to $n_{max}$)), wherein each contact pad of a first set of contact pads 404 of the plurality of contact pads 404, 406 may be respectively connected to the control region 204c of corresponding select transistors 204, and wherein each contact pad of a second set of contact pads 406 of the plurality of contact pads 404, 406 may be respectively connected to the first controlled region 204a of corresponding select transistors 204, so that an unambiguous assignment of each select transistor 204 to respectively two contact pads (e.g., one contact pad of the contact pads 404, and one contact pad of the contact pads 406 shown in FIG. 4A) may be provided, such that each select transistor 204 may be individually addressed by the plurality of contact pads 404, 406 (e.g. contact pads CP1(1 to $m_{max}$) and contact pads CP2(1 to $n_{max}$)).

According to various embodiments, as shown in FIG. 4A, each select transistor 204 of the plurality of select transistors T(1 to $m_{max}$, 1 to $n_{max}$) may be individually addressed by a pair of contact pads. According to various embodiments, each select transistor 204 of the plurality of select transistors T(1 to $m_{max}$, 1 to $n_{max}$) may be individually addressed by one contact pad of the first set of contact pads 404 (e.g. contact pads CP1(1 to $m_{max}$)) and one contact pad of the second set of contact pads 406 (e.g. contact pads CP2(1 to $n_{max}$)), e.g. one contact pad of the 1 to $n_{max}$ contact pads 406 being connected to the first controlled region 204a of the corresponding select transistors T(1 to $m_{max}$, n) and one contact pad of the 1 to $m_{max}$ contact pads 404 being connected to the control region 204c of the corresponding select transistors T(m, 1 to $n_{max}$), as shown in FIG. 4A.

According to various embodiments, an unambiguous assignment of each select transistor 204 (e.g. of each select transistor T(m, n)) to respectively two contact pads may be provided (e.g. to corresponding contact pad CP1(m) and corresponding contact pad CP2(n)), such that each select transistor 204 may be individually addressed by the two contact pads. According to various embodiments, contact pad CP1(1) and contact CP2(1) may address select transistor T(1, 1), wherein a signal (e.g. a current, e.g. a test signal) may be generated, while controlling the control region 204c of the select transistor T(1, 1) by a voltage applied on contact pad CP1(1) (e.g. applying a voltage on the control gate of the select transistor). Since the signal (e.g. a current, e.g. a test signal) for the unambiguously assigned test structure element 104 may be provided via the select transistor 204 (e.g. select transistor T(1, 1) provides the signal (e.g. a current, e.g. a test signal) for the test structure element TS(1, 1) by using the contact pads CP1(1) and CP2(1), as shown in FIG. 4A), each of the plurality of $m_{max}$ times $n_{max}$ test structure elements 104 may be individually addressed by the $m_{max}$+$n_{max}$ contact pads 404, 406 (e.g. test structure elements TS(1 to $m_{max}$, 1 to $n_{max}$) may be individually addressed by the contact pads CP1(1 to $m_{max}$) and CP2(1 to $n_{max}$)).

According to various embodiments, the first set of contact pads 404 may be aligned along the first direction 110 and the second set of contact pads 406 may be aligned along the second direction 112.

According to various embodiments, a test structure arrangement (e.g. an integrated test circuit) may further include at least one common contact pad. According to various embodiments, the test lines of the plurality of test structure elements may be electrically connected to the least one common contact pad (CCP).

Figure 4B:
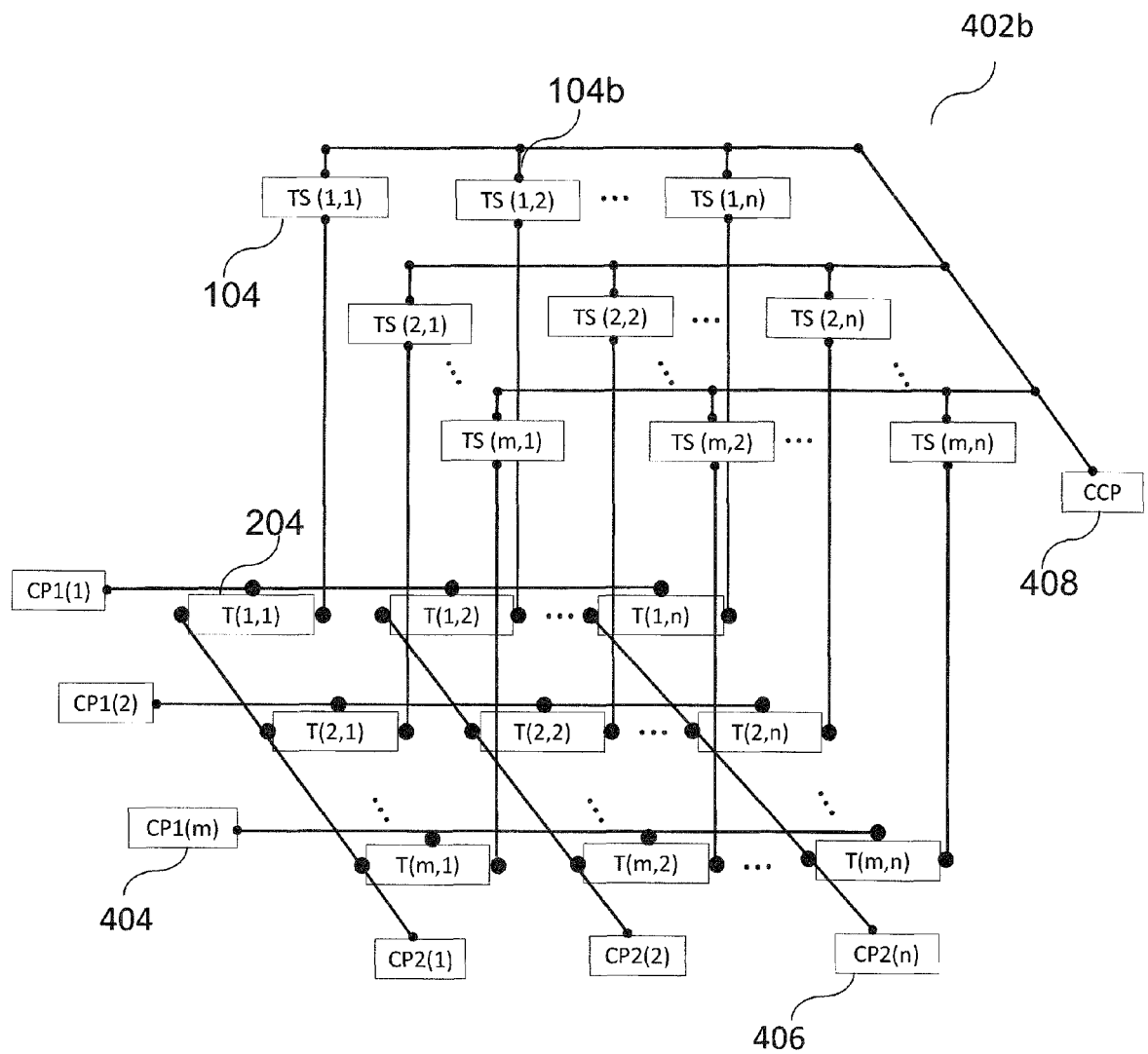
FIG. 4B shows an arrangement of a plurality of test structure elements, a plurality of select transistors, a plurality of contact pads, and a common contact pad, wherein each test structure element may have one test line respectively.

As shown in FIG. 4B, according to various embodiments, a test structure arrangement 402b (e.g. an integrated test circuit) may include a plurality of test structure elements 104, a plurality of select transistors 204, a common contact pad 408 and a plurality of contact pads 404, 406 (e.g. contact pads CP1(1 to $m_{max}$) and contact pads CP2(1 to $n_{max}$)), wherein each contact pad of a first set of contact pads 404 of the plurality of contact pads 404, 406 may be respectively connected to the control region 204c of corresponding select transistors 204, and wherein each contact pad of a second set of contact pads 406 of the plurality of contact pads 404, 406 may be respectively connected to the first controlled region 204a of corresponding select transistors 204, so that an unambiguous assignment of each select transistor 204 to respectively two contact pads may be provided, such that each select transistor 204 may be individually addressed by the plurality of contact pads 404, 406 (e.g. contact pads CP1(1 to $m_{max}$) and contact pads CP2(1 to $n_{max}$)), in analogy to test structure arrangement 402a shown in FIG. 4A.

According to various embodiments, all test lines 104b (e.g. a number of $m_{max}$ times $n_{max}$ test lines 104b of the plurality of test structure elements 104 TS(1 to $m_{max}$,1 to $n_{max}$)) may be electrically connected to one common contact pad 408 (CCP), as shown in FIG. 4B. According to various embodiments, contact pad CP1(1) and contact CP2(1) may address select transistor T(1, 1), wherein a signal (e.g. a current, e.g. a test signal) may be generated by applying a voltage between contact pad CP2(1) and the common contact pad 408 (CCP), while controlling the control region 204c of the select transistor T(1, 1) by a voltage applied on contact pad CP1(1) (e.g. applying a voltage on the control gate of the select transistor).

Figure 4C:
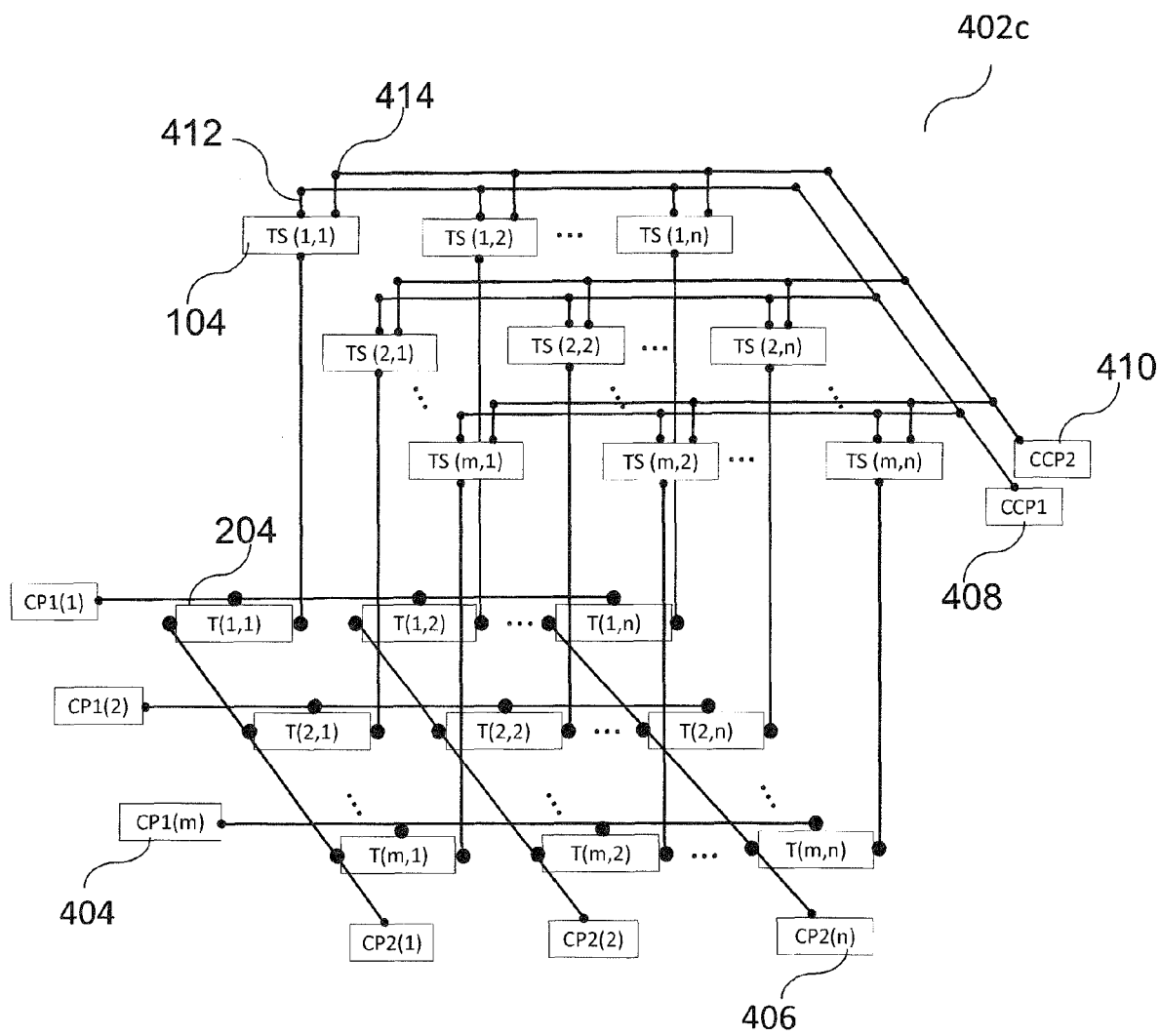
FIG. 4C shows an arrangement of a plurality of test structure elements, a plurality of select transistors, a plurality of contact pads, and two common contact pads, wherein each test structure element may have two test lines respectively.

According to various embodiments, more than one common contact pad (CCP) may be included in a test structure arrangement, wherein each test structure element of the plurality of test structure elements may include more than one test line accordingly. As shown in FIG. 4C, according to various embodiments, a test structure arrangement 402c (e.g. an integrated test circuit) may include a plurality of test structure elements 104, a plurality of select transistors 204, two common contact pads 408, 410 and a plurality of contact pads 404, 406 (e.g. contact pads CP1(1 to $m_{max}$) and contact pads CP2(1 to $n_{max}$)). According to various embodiments, each test structure element 104 of the plurality of test structure elements may include two test lines 412, 414. According to various embodiments, all test lines 412 (e.g. a number of $m_{max}$ times $n_{max}$ test lines 412 of the plurality of test structure elements 104 TS(1 to $m_{max}$,1 to $n_{max}$)) may be electrically connected to a first common contact pad 408 (CCP1), in analogy to test structure arrangement 402b as shown in FIG. 4B. Further, according to various embodiments, all test lines 414 (e.g. a number of $m_{max}$ times $n_{max}$ test lines 414 of the plurality of test structure elements 104 TS(1 to $m_{max}$,1 to $n_{max}$)) may be electrically connected to a second common contact pad 410 (CCP2).

Figure 4D:
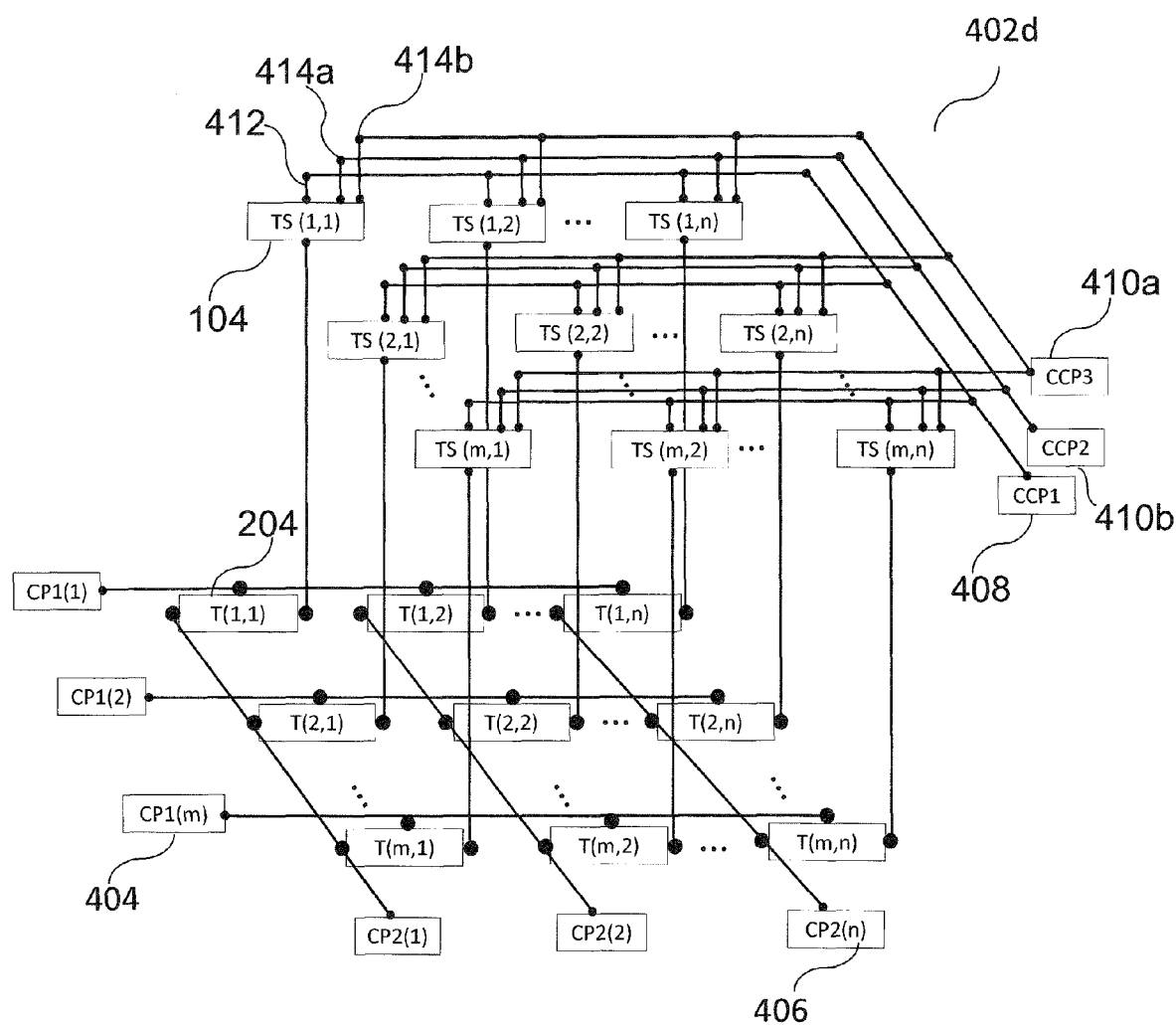
FIG. 4D shows an arrangement of a plurality of test structure elements, a plurality of select transistors, a plurality of contact pads, and three common contact pads, wherein each test structure element may have three test lines respectively.

According to another embodiment, more than two common contact pads (CCP) may be included in a test structure arrangement, wherein each test structure element of the plurality of test structure elements may include more than two test lines accordingly. As shown in FIG. 4D, according to various embodiments, a test structure arrangement 402d (e.g. an integrated test circuit) may include a plurality of test structure elements 104, a plurality of select transistors 204, three common contact pads 408, 410a, 410b and a plurality of contact pads 404, 406 (e.g. contact pads CP1(1 to $m_{max}$) and contact pads CP2(1 to $n_{max}$)). According to various embodiments, each test structure element 104 of the plurality of test structure elements may include three test lines 412, 414a, 414b. According to various embodiments, all test lines 412 (e.g. a number of $m_{max}$ times $n_{max}$ test lines 412 of the plurality of test structure elements 104 TS(1 to $m_{max}$,1 to $n_{max}$)) may be electrically connected to a first common contact pad 408 (CCP1), in analogy to test structure arrangement 402b as shown in FIG. 4B. Further, according to various embodiments, all test lines 414a (e.g. a number of $m_{max}$ times $n_{max}$ test lines 414a of the plurality of test structure elements 104 TS(1 to $m_{max}$,1 to $n_{max}$)) may be electrically connected to a second common contact pad 410a (CCP2), in analogy to test structure arrangement 402c as shown in FIG. 4C. Further, according to various embodiments, all test lines 414b (e.g. a number of $m_{max}$ times $n_{max}$ test lines 414b of the plurality of test structure elements 104 TS(1 to $m_{max}$,1 to $n_{max}$)) may be electrically connected to a third common contact pad 410b (CCP3).

According to various embodiments, the additional common contact pads, which means the second contact pad (CCP2) and the third contact pad (CCP3), as shown in FIG. 4C and FIG. 4D, may have the same properties as the common contact pad (CCP) as described herein.

According to various embodiments, a specific number of test structure elements (e.g. $m_{max}$ times $n_{max}$ test structure elements) may be addressed by a smaller number of contact pads (e.g. $m_{max}+n_{max}$ contact pads). By way of example, using 200 contact pads may enable the individual testing of about 10,000 test structure elements. According to various embodiments, using 20 contact pads may enable the individual testing of 100 test structure elements. According to various embodiments, using 20 contact pads may enable the individual testing of about 36 test structure elements.

According to various embodiments, the contact pads (e.g. the first set of contact pads 404 and the second set of contact pads 406 as described before) may be aligned along a line. According to various embodiments, the contact pads may be aligned as desired for an optimal connection to a test device (e.g. a bed of nails tester, e.g. all contact pads may be aligned along a single line).

According to various embodiments, the individual testing of the test structure elements 104 may be controlled using the respective combinations of contact pads 404, 406 selected by an external test device (e.g. by using a test program e.g. by using software).

According to various embodiments, the test structure arrangements 402a, 402b, 402c, 402d as shown in FIGS. 4A to 4D may be at least part of an integrated circuit. According to various embodiments, the test structure arrangements 402a, 402b, 402c, 402d as shown in FIGS. 4A to 4D may be at least part of an integrated test circuit. According to various embodiments, the test structure arrangements 402a, 402b, 402c, 402d as shown in FIGS. 4A to 4D may be at least part of a chip, e.g. a test chip.

According to various embodiments, a lateral dimension of a select transistor (e.g. the lateral dimension of select transistor 204) may be small compared to a size of a test structure element (e.g. the size of test structure element 104). According to various embodiments, the lateral dimension of the select transistor arrangement 202 may be smaller than the lateral dimension of the test structure 102. According to various embodiments, the select transistor arrangement 202 may be arranged below the test structure 102 (e.g. arranged on a main processing surface of a wafer below a test structure). According to various embodiments, the select transistor arrangement 202 may be arranged in a layer below the test structure 102 (e.g. an electrically insulating layer may be arranged between the select transistor arrangement 202 and the test structure 102).

According to various embodiments, various process parameters may be determined (or tested) using a three-dimensional test structure arrangement (e.g. using a test structure arrangement which may be described by three pointer variables m, n, and k,). In analogy to the embodiments as described before, a plurality of test structure elements may be included in the three-dimensional test structure arrangement, wherein the test structure elements of the plurality of test structure elements may be identified by a tuple, in this case a 3-tuple (m, n, k), including three pointer variables m, n, and k. Therefore, the test structure arrangement (e.g. the test structure arrangement 502 as shown in FIG. 5 and further described below) may be described as a three-dimensional test structure arrangement, wherein a specific arrangement of the structure elements included in a three-dimensional test structure arrangement (e.g. select transistors, test structure elements, contact pads, and the like) on a wafer (e.g. within an integrated circuit on a main processing surface of a wafer) may differ from the schematically shown arrangement in the exemplarily shown figures included herein.

According to various embodiments, the two-dimensional arrangement of test structure elements, as described before (e.g. test structure 102), may be included k times in a three-dimensional test structure arrangement. The following description may refer to the embodiments as described before, wherein the integrated test circuit may include an extension to three pointer variables m, n, and k (m, n, k) for describing the arrangement of structure elements, wherein the structure elements may include at least one of a plurality of select transistors T, a plurality of pre-select transistors PT, a plurality of contact pads CP1, CP2, CP3, a plurality of test structure elements TS, and a common contact pad CCP, as shown in FIG. 5.

Figure 5:
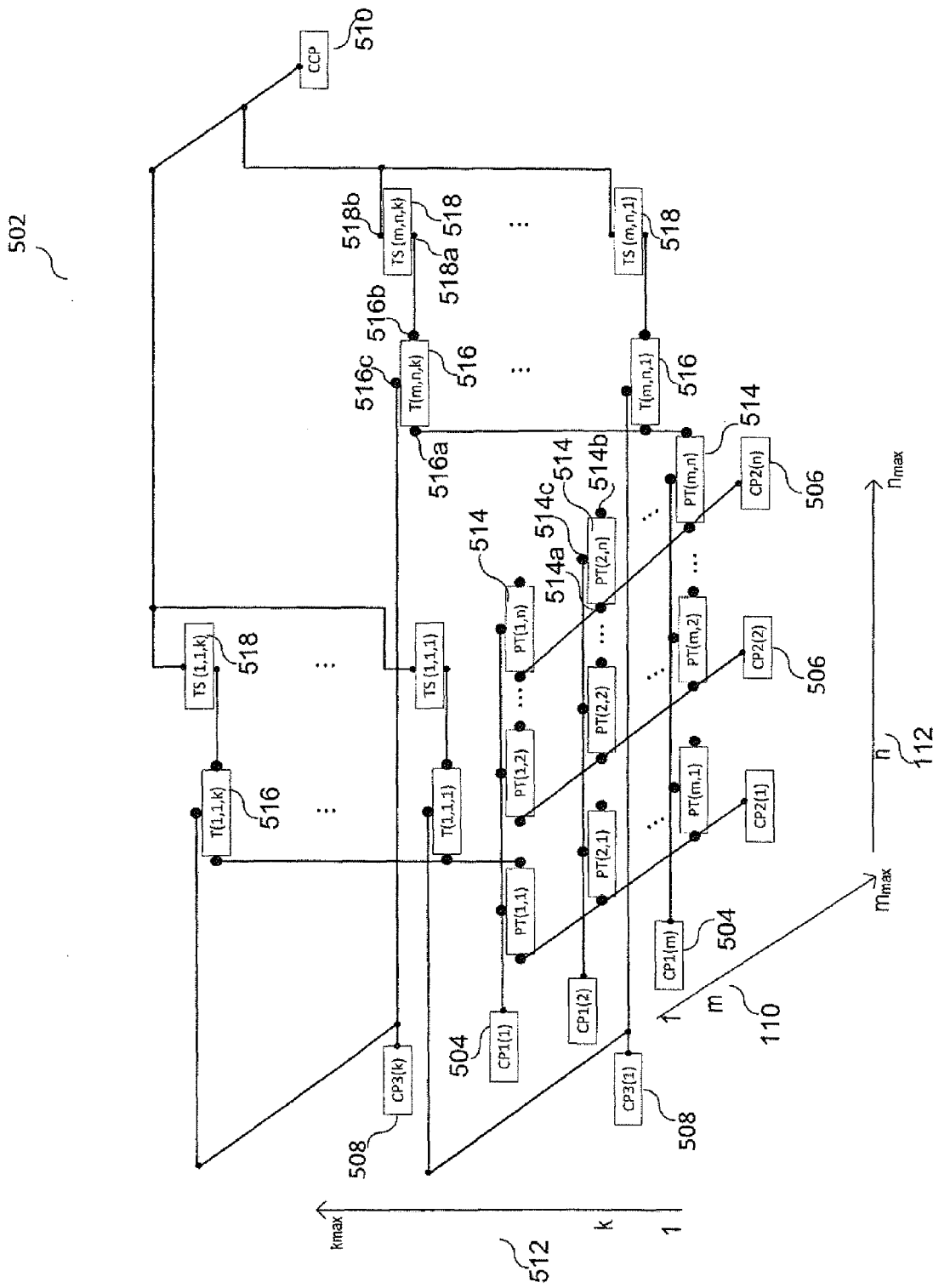
FIG. 5 shows a three-dimensional arrangement of a plurality of test structure elements, wherein each test structure element of the plurality of test structure elements may be individually addressed by the set of contact pads via an arrangement of pre-select transistors, an arrangement of select transistors, and a common contact pad, according to various embodiments.

FIG. 5 shows a three-dimensional test structure arrangement 502, according to various embodiments. As shown in FIG. 5, according to various embodiments, the select transistor arrangement 202, as described referring to FIG. 2A and FIG. 2B, may be adapted as a pre-select structure, which may be included in the three-dimensional test structure arrangement 502. According to various embodiments, the pre-select structure may include a plurality of pre-select transistors 514 (PT). According to various embodiments, a set or a subset of pre-select transistors 514 arranged in a two-dimensional pre-select transistor arrangement may be identified by using the pointer variables m and n (as already described), wherein the tuple PT(m, n) may identify an arbitrary pre-select transistor 514 (since m and n may represent a number in the range of 1 to $m_{max}$ and 1 to $n_{max}$ respectively), the tuple PT(1, 1) for example may identify one specific pre-select transistor 514 (since m and n are now fixed to specific numbers, i.e. m=1 and n=1 in this case), the tuple PT(1 to $m_{max}$, 1 to $n_{max}$) may identify the whole set of pre-select transistors 514 (in analogy to the description referring to FIG. 2A), the tuple PT(1 to $m_{max}$, n) may identify a plurality of pre-select transistors 514 along the first direction 110 (since m may range from 1 to $m_{max}$ and n represents a number in the range of 1 to $n_{max}$), and the tuple PT(m, 1 to $n_{max}$) may identify a plurality of pre-select transistors 514 along the second direction 112. It should be noted, that the tuple PT(1, 2) refers to another pre-select transistor 514 than the tuple PT(2, 1), since the notation as tuple refers to a set of ordered numbers.

According to various embodiments, each pre-select transistor 514 of the plurality of pre-select transistors may have a first controlled region 514a (which may be a first source/drain region, e.g. a source region, according to various embodiments), a second controlled region 514b (which may be a second source/drain region, e.g. a drain region, according to various embodiments), and a control region 514c (which may be a control gate, according to various embodiments). According to various embodiments, the pre-select transistor 514 may be a field effect transistor. According to various embodiments, the pre-select transistor 514 may be a bipolar transistor, wherein the bipolar transistor may have a first emitter/collector region, e.g. an emitter region, (which may correspond to a first controlled region), a second emitter/collector region, e.g. a collector region, (which may correspond to a second controlled region), and a base region (which may correspond to a control region).

According to various embodiments, all pre-select transistors PT(1 to $m_{max}$, 1 to $n_{max}$) of the plurality of pre-select transistors 514 may be of the same type. According to various embodiments, at least one pre-select transistor of the plurality of pre-select transistors 514 may be of a different type than the other pre-select transistors. According to various embodiments, at least one pre-select transistor of the plurality of pre-select transistors 514 may serve to transfer a signal (e.g. a current, e.g. a test signal) to a plurality of select transistors. According to various embodiments, the second controlled region 514b of at least one pre-select transistor of the plurality of pre-select transistors 514 may be electrically connected to at least one select transistor. According to various embodiments, the second controlled region 514b of each pre-select transistor of the plurality of pre-select transistors 514 may be electrically connected to a corresponding plurality of select transistors 516.

As shown in FIG. 5, the three-dimensional test structure arrangement 502 may include a plurality of select transistors 516 (e.g. select transistors T(1 to $m_{max}$, 1 to $n_{max}$, 1 to $k_{max}$)). According to various embodiments, a set or a subset of select transistors 516 being arranged in a three-dimensional select transistor arrangement (e.g. in a three-dimensional logical arrangement) may be identified by using the three pointer variables m, n and k (in the same way as already described), wherein the tuple T(m, n, k) may identify an arbitrary select transistor 516 (since m, n and k may represent a number in the range of 1 to $m_{max}$, 1 to $n_{max}$ and 1 to $k_{max}$ respectively), the tuple T(1, 1, 1) for example may identify one specific select transistor 516 (since m, n and k are now fixed to specific numbers, i.e. m=1, n=1, and k=1 in this case), the tuple T(1 to $m_{max}$, 1 to $n_{max}$, 1 to $k_{max}$) may identify the whole set of select transistors 516, and the tuple T(m, n, 1 to $k_{max}$) may identify a plurality of select transistors 516 along a third direction 512 (since k may range from 1 to $k_{max}$, wherein m and n represent respectively numbers in the range of 1 to $m_{max}$ and 1 to $n_{max}$). According to various embodiments, the tuple T(1 to $m_{max}$, 1 to $n_{max}$, k) may identify a plurality of select transistors 516 which may be included in a plane, wherein the plane may be spanned by the first direction 110 and the second direction 112, as shown in FIG. 5. Further, according to various embodiments, the subset of select transistors T(1 to $m_{max}$, 1 to $n_{max}$, k) may be seen as a two-dimensional arrangement of select transistors T(1 to $m_{max}$, 1 to $n_{max}$) in analogy to select transistor arrangement 202, as described referring to FIG. 2A and FIG. 2B, which may be included $k_{max}$ times in the three-dimensional test structure arrangement 502. It has to be noted, that the tuple T(1, 2, 3) refers to another select transistor 516 than the tuple T(2, 1, 3) (or T(3, 2, 1), . . . ), since the notation as tuple refers to a set of ordered numbers.

According to various embodiments, each select transistor 516 of the plurality of select transistors may be unambiguously assigned to one test structure element 518 of the plurality of test structure elements TS(1 to $m_{max}$, 1 to $n_{max}$, 1 to $k_{max}$). According to various embodiments, each select transistor T(m, n, k) may be unambiguously assigned to the corresponding test structure element TS(m, n, k) (e.g. select transistor T(1, 1, 1) may be assigned to test structure element TS(1, 1, 1), select transistor T(1, 1, k) may be assigned to test structure element TS(1, 1, k), and the like), as shown in FIG. 5. According to various embodiments, a select transistor 516, as described with respect to FIG. 5, may be the same as a select transistor 204 described before referring to FIG. 2A and FIG. 2B, e.g. a select transistors 516 may include a first controlled region 516a, a second controlled region 516b, and a control region 516c. According to various embodiments, the pre-select transistors 514 and the select transistors 516 may be of the same type. According to various embodiments, the test structure elements 518, as described with respect to FIG. 5, may be the same as the test structure elements 104 described before referring to FIG. 1A to FIG. 1D (but may have a different spatial arrangement or layout), e.g. the test structure elements 518 may respectively include at least a test line 518b and a supply line 518a.

According to various embodiments, as shown in FIG. 5, all test lines 518b of the plurality of test structure elements 518 may be connected to a common contact pad 510. According to various embodiments, the supply line 518a of each test structure element 518 may be electrically connected to the second controlled region 516b (e.g. a second source/drain region, e.g. drain region, of a select transistor, which may be a field effect transistor) of the corresponding select transistor 516. As shown in FIG. 5, the supply line 518a of test structure element TS(m, n, k) may be electrically connected to the second controlled region 516b of the corresponding select transistor T(m, n, k). According to various embodiments, the total number of test structure elements 518 (e.g. $m_{max}$ times $n_{max}$ times $k_{max}$) may be equal to the total number of select transistors 516 (e.g. $m_{max}$ times $n_{max}$ times $k_{max}$). According to various embodiments, the total number of ($m_{max}$ times $n_{max}$ times $k_{max}$) test structure elements 518 may require a total number of ($m_{max}$ times $n_{max}$) pre-select transistors 514 to individually address the test structure elements 518.

According to various embodiments, the first controlled region 516a of a plurality of select transistors 516 may be electrically connected to the second controlled region of the corresponding pre-select transistor 514. According to various embodiments, the first controlled region 516a of each select transistor 516 of the set of select transistors T(m, n, 1 to $k_{max}$) may be electrically connected to the second controlled region 514b of the corresponding pre-select transistor PT(m, n), as shown in FIG. 5. In other words, the pre-select transistor PT(m, n) may be the corresponding pre-select transistor to the set of select transistors T(m, n, 1 to $k_{max}$), according to various embodiments. In still other words, the second controlled region 514b of the pre-select transistor PT(m, n) may be electrically connected to the first controlled region 516a of each select transistor 516 of the set of select transistors T(m, n, 1 to $k_{max}$), according to various embodiments. According to various embodiments, the set of select transistors T(m, n, 1 to $k_{max}$) may also be referred to as an select transistor arrangement (or as an one-dimensional select transistor arrangement), wherein a plurality (e.g. $m_{max}$ times $n_{max}$) of one-dimensional select transistor arrangements T(m, n, 1 to $k_{max}$) may be included in a select structure, wherein the select structure may include the select transistors T(1 to $m_{max}$, 1 to $n_{max}$, 1 to $k_{max}$).

According to various embodiments, a plurality of one-dimensional select transistor arrangements (e.g. $m_{max}$ times $n_{max}$ select transistor arrangements T(m, n, 1 to $k_{max}$)) may be included in an integrated test circuit (e.g. in the three-dimensional test structure arrangement 502), wherein the plurality of one-dimensional select transistor arrangements may form a select structure including the select transistors T(1 to $m_{max}$, 1 to $n_{max}$, 1 to $k_{max}$).

As shown in FIG. 5, according to various embodiments, the three-dimensional test structure arrangement 502 may further include a plurality of contact pads 504, 506, 508, wherein each contact pad of a first set of contact pads 504 of the plurality of contact pads 504, 506, 508 may be respectively connected to the first controlled region 514a of corresponding pre-select transistors 514, and wherein each contact pad of a second set of contact pads 506 of the plurality of contact pads 504, 506, 508 may be respectively connected to the control region 514c of corresponding pre-select transistors 514, so that an unambiguous assignment of each pre-select transistor 514 to respectively two contact pads 504, 506 may be provided, such that each select transistor 514 may be individually addressed by the first set of contact pads 504 and the second set of contact pads 506, and wherein each contact pad of a third set of contact pads 508 of the plurality of contact pads 504, 506, 508 may be respectively connected to the control region 516c of corresponding select transistors 516.

According to various embodiments, as shown in FIG. 5, each pre-select transistor PT(m, n) of the plurality of pre-select transistors PT(1 to $m_{max}$, 1 to $n_{max}$) may be individually addressed by a pair of contact pads. According to various embodiments, each pre-select transistor PT(m, n) of the plurality of pre-select transistors PT(1 to $m_{max}$, 1 to $n_{max}$) may be individually addressed by one contact pad of a first set of contact pads 504 (e.g. one contact pad of the first set of contact pads CP1(1 to $m_{max}$)) and one contact pad of a second set of contact pads 506 (e.g. one contact pad of the second set of contact pads CP2(1 to $n_{max}$)), e.g. one contact pad CP2(n) of the 1 to $n_{max}$ contact pads CP2(1 to $n_{max}$) being connected to the first controlled region 514a of the corresponding pre-select transistors PT(1 to $m_{max}$, n) and one contact pad CP1 (m) of the 1 to $m_{max}$ contact pads CP1(1 to $m_{max}$) being connected to the control region 514c of the corresponding pre-select transistors PT(m, 1 to $n_{max}$).

According to various embodiments, each pre-select transistor 514 (e.g. pre-select transistor PT(m, n)) may be unambiguously assigned to respectively two contact pads (e.g. corresponding contact pad CP1(m) and corresponding contact pad CP2(n)), such that each pre-select transistor 514 may be individually addressed by the two corresponding contact pads. As for example, according to various embodiments, pre-select transistor PT(1, 1) may be addressed by contact pad CP1(1) and contact pad CP2(1) and pre-select transistor PT(2, 3) may be addressed by contact pad CP1(2) and contact pad CP2(3), and the like, as shown in FIG. 5.

According to various embodiments, each contact pad 508 of the third set of contact pads CP3(1 to $k_{max}$) may be connected to the control regions 516c of the respective set of select transistors 516 of the plurality of select transistors 516. According to various embodiments, the control regions 516c of $m_{max}$ times $n_{max}$ select transistors 516 may be electrically connected to one contact pad 518 of the third set of contact pads CP3(1 to $k_{max}$). According to various embodiments, as shown in FIG. 5, the control regions 516c of a plurality of select transistors T(1 to $m_{max}$, 1 to $n_{max}$, k) may be electrically connected to the corresponding contact pad CP3(k), e.g. each control region 516c of select transistors T(1 to $m_{max}$, 1 to $n_{max}$,1) may be electrically connected to the corresponding contact pad CP3(1), e.g. each control region 516c of select transistors T(1 to $m_{max}$, 1 to $n_{max}$, 2) may be electrically connected to the corresponding contact pad CP3(2), and so on.

According to various embodiments, each select transistor of a three-dimensional test structure arrangement (e.g. three-dimensional test structure arrangement 502) may be individually addressed by three contact pads. According to various embodiments, as shown in FIG. 5, each select transistor T(m, n, k) may be individually addressed by one contact pad of the first set of contact pads 504 (e.g. contact pad CP1(m)), one contact pad of the second set of contact pads 506 (e.g. contact pad CP2(n)), and one contact pad of the third set of contact pads 508 (e.g. contact pad CP3(k)). For example, as shown in FIG. 5, the select transistor T(1, 1, 1) may be individually addressed by contact pad CP1(1), contact pad CP2(1), and contact pad CP3(1), the select transistor T(2, 1, 3) may be individually addressed by contact pad CP1(2), contact pad CP2(1), and contact pad CP3(3), and the like. According to various embodiments, a test structure element 518 may be unambiguously assigned to each select transistor 516 and therefore each test structure element 518 may be individually addressed in the same way as the corresponding select transistor 516 using three contact pads, wherein each test structure element TS(m, n, k) may be individually addressed by one contact pad of the first set of contact pads 504 (e.g. contact pad CP1(m)), one contact pad of the second set of contact pads 506 (e.g. contact pad CP2(n)), and one contact pad of the third set of contact pads 508 (e.g. contact pad CP3(k)). For example, as shown in FIG. 5, the test structure element TS(1, 1, 1) may be individually addressed by contact pad CP1(1), contact pad CP2(1), and contact pad CP3(1), and the like.

According to various embodiments, the first set of contact pads 504 may be aligned along the first direction 110, the second set of contact pads 506 may be aligned along the second direction 112, and the third set of contact pads 508 may be aligned along the third direction 512, as shown in FIG. 5.

According to various embodiments, a specific number of test structure elements (e.g. $m_{max}$ times $n_{max}$ times $k_{max}$ test structure elements) may by individually addressed by a smaller number of contact pads (e.g. $m_{max}+n_{max}+k_{max}$ contact pads). For example, using 300 contact pads and one common contact pad may enable the individual testing of one million test structure elements, according to various embodiments. According to various embodiments, using 30 contact pads may enable the individual testing of about 1000 test structure elements.

According to various embodiments, the contact pads (e.g. the first set of contact pads 504, the second set of contact pads 506, and the third set of contact pads 508 as described before) may be aligned along a line. According to various embodiments, the common contact pad (e.g. 510, e.g. 408) may be arranged within the plurality of contact pads which may also include for example the first set of contact pads 504, the second set of contact pads 506, and the third set of contact pads 508. According to various embodiments, the contact pads (e.g. the first set of contact pads 504, the second set of contact pads 506, and the third set of contact pads 508 (and the common contact pad 510) as described before) may be aligned as desired for an optimal connection to a test device (e.g. a bed of nails tester, wherein about 30 contact pads may be arranged along a single line).

According to various embodiments, the three-dimensional test structure arrangement 502 as shown in FIG. 5 may be at least part of an integrated circuit. According to various embodiments, the three-dimensional test structure arrangement 502 as shown in FIG. 5 may be at least part of a chip. According to various embodiments, the three-dimensional test structure arrangement 502 as shown in FIG. 5 may be at least part of an integrated test circuit. According to various embodiments, the three-dimensional test structure arrangement 502 as shown in FIG. 5 may be at least part of a test chip.

According to various embodiments, the lateral dimension of a select transistor arrangement including the select transistors 204 or the select transistors 516 may be small compared to the size of a test structure element arrangement including the test structure elements 104 or the test structure elements 518. According to various embodiments, the lateral dimension of a select transistor arrangement including the select transistors 516 and the pre-select transistor arrangement including the pre-select transistors 514 may be smaller than the lateral dimension of a three-dimensional test structure element arrangement including the test structure elements 518. According to various embodiments, the select transistor arrangement and the pre-select transistor arrangement may be provided below the test structure elements.

According to various embodiments, the functionality of the integrated test circuit (or the test structure, or the three-dimensional test structure arrangement) may be achieved by the included structure elements (e.g. contact pads, select transistors, pre-select transistors, test structure elements) in conjunction with the electrical connections between them, as for example described referring to FIGS. 4A to 4D and FIG. 5. Therefore, the specific arrangement of the included structure elements and the specific shape of the electrical connections in an integrated test circuit may differ from the described arrangements without losing the functionality. According to various embodiments, the electrical connections may be provided such that the structure elements may be arbitrarily arranged.

According to various embodiments, as described herein, a test structure element $TS(m', n', k')$ may be unambiguously assigned to a select transistor $T(m'', n'', k'')$ if there is a direct relation between $m''$ and $m'$, between $n''$ and $n'$, and between $k''$ and $k'$. That is, if $m''$ equals $m'$, $n''$ equals $n'$, and $k''$ equals $k'$ ($m''=m'$, $n''=n'$, and $k''=k'$), test structure element $TS(m'', n'', k'')$ is unambiguously assigned to select transistor $T(m', n', k')$. For example, test structure element $TS(1, 1, 1)$ may be unambiguously assigned to select transistor $T(1, 1, 1)$. Furthermore, according to various embodiments, as described herein, a plurality of select transistors $T(m', n', k')$ may be assigned to a single pre-select transistor $T(m'', n'')$ if $m''=m'$ and $n''=n'$. For example, select transistors $T(1, 1, 1$ to $k_{max})$ may be all assigned to pre-select transistor $PT(1, 1)$. Furthermore, according to various embodiments, as described herein, a select transistor $T(m', n', k')$ or a test structure element $TS(m', n', k')$ may be unambiguously assigned to three contact pads $CP1(m'')$, $CP2(n'')$, and $CP3(k'')$ if $m''=m'$ and $n''=n'$ and $k''=k'$. For example, $CP1(3)$, $CP2(1)$, and $CP3(2)$ may be unambiguously assigned to the select transistor $T(3, 1, 2)$ or the test structure element $TS(3, 1, 2)$. Furthermore, according to various embodiments, as described herein, a select transistor $T(m', n')$ or a test structure element $TS(m', n')$ may be unambiguously assigned to two contact pads $CP1(m'')$ and $CP2(n'')$, if $m''=m'$ and $n''=n'$. For example, $CP1(3)$ and $CP2(1)$ may be unambiguously assigned to the select transistor $T(3, 1)$ or the test structure element $TS(3, 1)$.

FIG. 6 shows a flow diagram for a method 600 for manufacturing an integrated test circuit as described referring to FIGS. 4A to 4D, according to various embodiments. The method 600 for manufacturing an integrated test circuit may include, in 610, providing a plurality of test structure elements, wherein each test structure element of the plurality of test structure elements includes a at least one supply line and at least one test line; further, in 620, providing a plurality of select transistors, wherein each select transistor of the plurality of select transistors is assigned to one corresponding test structure element, and wherein each select transistor includes a first controlled region, a second controlled region, and a control region, wherein the second controlled region of each select transistor is respectively electrically connected to the supply line of the corresponding test structure element, so that each select transistor is unambiguous assigned to the corresponding test structure element; and, in 630, providing a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads of the plurality of contact pads and each test structure element can be individually addressed by the plurality of contact pads.

Figure 7:
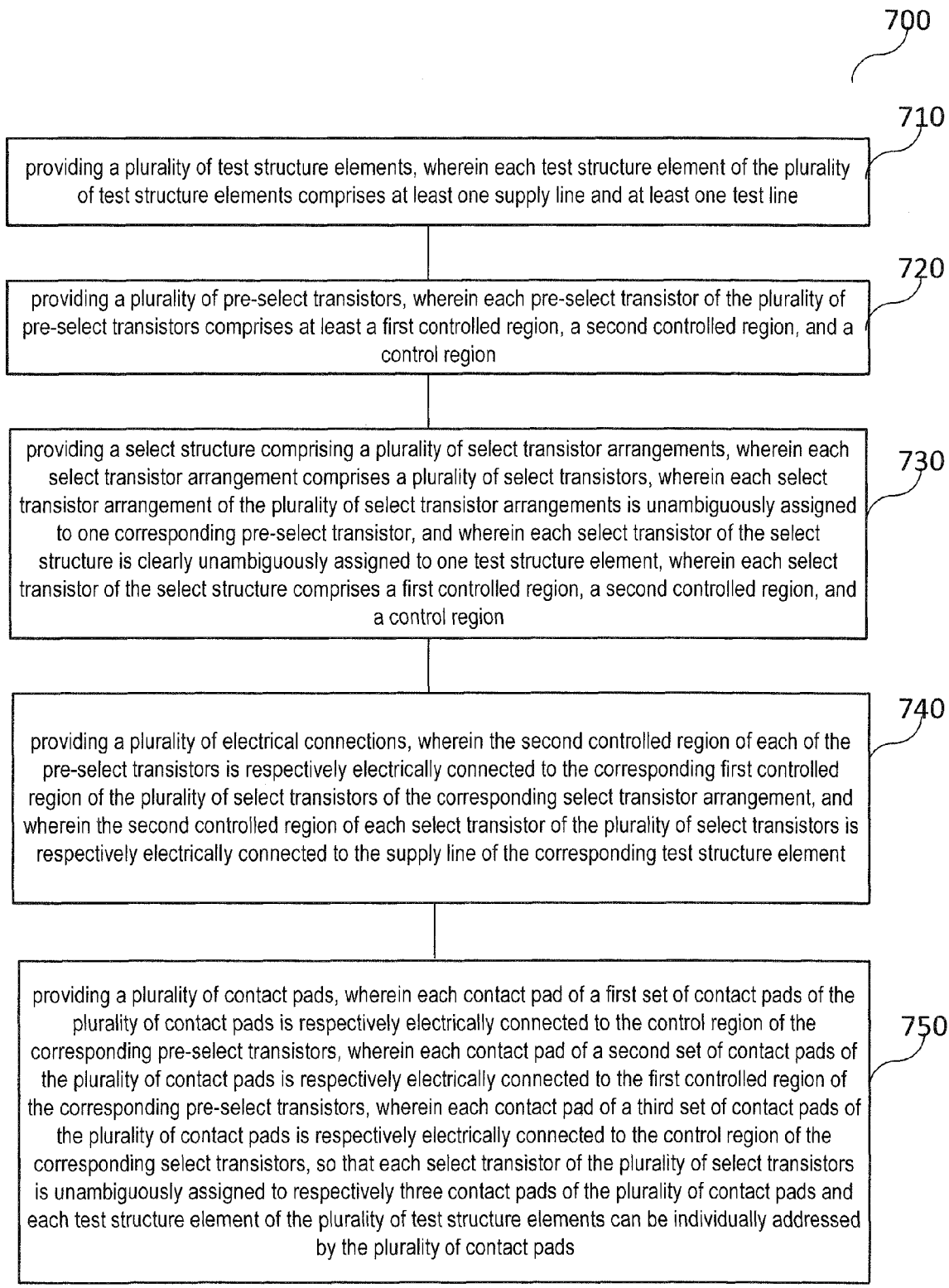

FIG. 7 shows a flow diagram for a method 700 for manufacturing an integrated test circuit as described referring to FIG. 5. The method 700 for manufacturing an integrated test circuit may include, in 710, providing a plurality of test structure elements, wherein each test structure element of the plurality of test structure elements includes at least one supply line and at least one test line; further, in 720, providing a plurality of pre-select transistors, wherein each pre-select transistor of the plurality of pre-select transistors includes at least a first controlled region, a second controlled region, and a control region; further, in 730, providing a select structure including a plurality of select transistor arrangements, wherein each select transistor arrangement includes a plurality of select transistors, wherein each select transistor arrangement of the plurality of select transistor arrangements is unambiguously assigned to one corresponding pre-select transistor, and wherein each select transistor of the select structure is clearly unambiguously assigned to one test structure element, wherein each select transistor of the select structure includes a first controlled region, a second controlled region, and a control region; further, in 740, providing a plurality of electrical connections, wherein the second controlled region of each of the pre-select transistors is respectively electrically connected to the corresponding first controlled region of the plurality of select transistors of the corresponding select transistor arrangement, and wherein the second controlled region of each select transistor of the plurality of select transistors is respectively electrically connected to the supply line of the corresponding test structure element; and, in 750, providing a plurality of contact pads, wherein each contact pad of a first set of contact pads of the plurality of contact pads is respectively electrically connected to the control region of the corresponding pre-select transistors, wherein each contact pad of a second set of contact pads of the plurality of contact pads is respectively electrically connected to the first controlled region of the corresponding pre-select transistors, wherein each contact pad of a third set of contact pads of the plurality of contact pads is respectively electrically connected to the control region of the corresponding select transistors, so that each select transistor of the plurality of select transistors is unambiguously assigned to respectively three contact pads of the plurality of contact pads and each test structure element of the plurality of test structure elements can be individually addressed by the plurality of contact pads.

According to various embodiments, each test structure element of the plurality of test structure elements may include at least one supply line and at least one test line, e.g. one supply line and one test line, e.g. one supply line and two test lines, e.g. one supply line and three test lines, e.g. more than one supply lines and one test line, e.g. more than one supply lines and two test lines, e.g. more than one supply lines and three test lines, and other possible numbers of test lines and numbers of supply lines.

According to various embodiments, a test structure arrangement (e.g. test structure arrangements 402b, 402c, 402d, or 502, as described above) may include more than one common contact pad, wherein at least one structure element of the plurality of test structure elements may include one test line. In other words, a first set of test structure elements of the plurality of test structure elements may be electrically connected to at least one common contact pad, wherein a second set of test structure elements of the plurality of test structure elements may be electrically connected to another common contact pad, which is not connected to a test structure element of the first set of test structure elements (not shown in figures). According to various embodiments, a first set of structure elements may be electrically connected to a first common contact pad, and a second set of structure elements may be electrically connected to a second common contact pad, wherein the first set of structure elements and a second set of structure elements may not include the same structure elements of the plurality of structure elements.

According to various embodiments, an integrated test circuit may include: a plurality of test structure elements, wherein each test structure element of the plurality of test structure elements includes at least one supply line and at least one test line; a plurality of select transistors, wherein each select transistor of the plurality of select transistors is assigned to one corresponding test structure element, and wherein each select transistor of the plurality of select transistors includes a first controlled region, a second controlled region, and a control region, wherein the second controlled region of each select transistor of the plurality of select transistors is respectively electrically connected to the supply line of the corresponding test structure element, so that each select transistor is unambiguously assigned to the corresponding test structure element; a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads of the plurality of contact pads and each test structure element can be individually addressed by the plurality of contact pads.

According to various embodiments, each test structure element of the plurality of test structure elements can be individually addressed by respectively two contact pads of the plurality of contact pads, wherein one contact pad is of the first set of contact pads and the other contact pad is of the second set of contact pads.

According to various embodiments, an integrated test circuit may further include at least one common contact pad, wherein the at least one common contact pad is electrically connected to the corresponding at least one test line of each test structure element of the plurality of test structure elements.

According to various embodiments, the total number of test structure elements may be equal to the total number of select transistors.

According to various embodiments, at least one test structure element of the plurality of test structure elements may include at least one of a via, a contact chain, a snake, and a comb line.

According to various embodiments, an integrated test circuit may be at least part of a chip.

According to various embodiments, an integrated test circuit may be formed at least in a kerf region of a wafer.

According to various embodiments, a plurality of select transistors may be integrated at least one of over and in a main processing surface of a wafer, wherein the plurality of select transistors may be arranged below the test structure elements.

According to various embodiments, at least one select transistor of the plurality of select transistors may be configured as a field effect transistor.

According to various embodiments, at least one select transistor of the plurality of select transistors may be configured as a bipolar transistor.

According to various embodiments, the total number of contact pads in the plurality of contact pads may be smaller than the total number of individually addressable select transistors.

According to various embodiments, the current supply for each test structure element may be respectively provided via the first controlled region and the second controlled region of the corresponding select transistor of the plurality of select transistors, wherein the corresponding select transistor is controlled via the corresponding contact pad which is electrically connected to the control region of the corresponding select transistor. According to various embodiments, the voltage supply for each test structure element may be respectively provided via the first controlled region and the second controlled region of the corresponding select transistor of the plurality of select transistors, wherein the corresponding select transistor is controlled via the corresponding contact pad which is electrically connected to the control region of the corresponding select transistor. According to various embodiments, the current supply and the voltage supply for each test structure element may be respectively provided via the first controlled region and the second controlled region of the corresponding select transistor of the plurality of select transistors, wherein the corresponding select transistor is controlled via the corresponding contact pad which is electrically connected to the control region of the corresponding select transistor. According to various embodiments, the current supply or the voltage supply for each test structure element may be respectively provided via the first controlled region and the second controlled region of the corresponding select transistor of the plurality of select transistors, wherein the corresponding select transistor is controlled via the corresponding contact pad which is electrically connected to the control region of the corresponding select transistor.

According to various embodiments, a total number of contact pads, including the plurality of contact pads and one common contact pad, may be $n_{max}+m_{max}+1$ and the total number of test structure elements may be $n_{max}$ times $m_{max}$, wherein $m_{max}$ and $n_{max}$ are natural numbers larger than one respectively.

According to various embodiments, a method for manufacturing an integrated test circuit may include: providing a plurality of test structure elements, wherein each test structure element of the plurality of test structure elements includes at least one supply line and at least one test line; providing a plurality of select transistors, wherein each select transistor of the plurality of select transistors is assigned to one corresponding test structure element, and wherein each select transistor includes a first controlled region, a second controlled region, and a control region, wherein the second controlled region of each select transistor is respectively electrically connected to the supply line of the corresponding test structure element, so that each select transistor is unambiguous assigned to the corresponding test structure element; providing a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads of the plurality of contact pads and each test structure element can be individually addressed by the plurality of contact pads.

According to various embodiments, a method for manufacturing an integrated test circuit may further include providing at least one common contact pad, wherein the at least one common contact pad is electrically connected to the corresponding at least one test line of each test structure element of the plurality of test structure elements.

According to various embodiments, an integrated test circuit may include: a plurality of test structure elements, wherein each test structure element of the plurality of test structure elements includes at least one supply line and at least one test line; a plurality of pre select transistors, wherein each pre select transistor of the plurality of pre select transistors includes at least a first controlled region, a second controlled region, and a control region; a select structure including a plurality of select transistor arrangements, wherein each select transistor arrangement includes a plurality of select transistors, wherein each select transistor arrangement of the plurality of select transistor arrangements is unambiguously assigned to one corresponding pre select transistor, and wherein each select transistor of the select structure is clearly unambiguously assigned to one test structure element, wherein each select transistor of the select structure includes a first controlled region, a second controlled region, and a control region; a plurality of electrical connections, wherein the second controlled region of each of the pre select transistors is respectively electrically connected to the corresponding first controlled region of the plurality of select transistors of the corresponding select transistor arrangement, and wherein the second controlled region of each select transistor of the plurality of select transistors is respectively electrically connected to the supply line of the corresponding test structure element; a plurality of contact pads, wherein each contact pad of a first set of contact pads of the plurality of contact pads is respectively electrically connected to the control region of the corresponding pre select transistors, wherein each contact pad of a second set of contact pads of the plurality of contact pads is respectively electrically connected to the first controlled region of the corresponding pre select transistors, wherein each contact pad of a third set of contact pads of the plurality of contact pads is respectively electrically connected to the control region of the corresponding select transistors, so that each select transistor of the plurality of select transistors is unambiguously assigned to respectively three contact pads of the plurality of contact pads and each test structure element of the plurality of test structure elements can be individually addressed by the plurality of contact pads.

According to various embodiments, each test structure element of a plurality of test structure elements may be individually addressed by three contact pads, wherein one contact pad is of the first set of contact pads, one contact pad is of the second set of contact pads, and one contact pad is of the third set of contact pads.

According to various embodiments, an integrated test circuit may further include at least one common contact pad, wherein the at least one common contact pad is electrically connected to the corresponding at least one test line of each test structure element of the plurality of test structure elements.

According to various embodiments, the total number of test structure elements may be equal to the total number of select transistors.

According to various embodiments, the total number of contact pads may be smaller than the total number of addressable test structure elements.

According to various embodiments, a total number of contact pads, including the plurality of contact pads and one common contact pad, may be $m_{max}+n_{max}+k_{max}+1$ and the total number of test structure elements is $m_{max}$ times $n_{max}$ times $k_{max}$, wherein $m_{max}$, $n_{max}$, and $k_{max}$ are natural numbers larger than one respectively.

According to various embodiments, a plurality of select transistors and a plurality of pre select transistors may be integrated at least one of over and in a main processing surface of the wafer, wherein the plurality of select transistors and the plurality of pre select transistors may be arranged below the test structure elements.

According to various embodiments, at least one pre select transistor may be configured as a field effect transistor.

According to various embodiments, a method for manufacturing an integrated test circuit may include: providing a plurality of test structure elements, wherein each test structure element of the plurality of test structure elements includes at least one supply line and at least one test line; providing a plurality of pre select transistors, wherein each pre select transistor of the plurality of pre select transistors includes at least a first controlled region, a second controlled region, and a control region; providing a select structure including a plurality of select transistor arrangements, wherein each select transistor arrangement includes a plurality of select transistors, wherein each select transistor arrangement of the plurality of select transistor arrangements is unambiguously assigned to one corresponding pre select transistor, and wherein each select transistor of the select structure is clearly unambiguously assigned to one test structure element, wherein each select transistor of the select structure includes a first controlled region, a second controlled region, and a control region; providing a plurality of electrical connections, wherein the second controlled region of each of the pre select transistors is respectively electrically connected to the corresponding first controlled region of the plurality of select transistors of the corresponding select transistor arrangement, and wherein the second controlled region of each select transistor of the plurality of select transistors is respectively electrically connected to the supply line of the corresponding test structure element; providing a plurality of contact pads, wherein each contact pad of a first set of contact pads of the plurality of contact pads is respectively electrically connected to the control region of the corresponding pre select transistors, wherein each contact pad of a second set of contact pads of the plurality of contact pads is respectively electrically connected to the first controlled region of the corresponding pre select transistors, wherein each contact pad of a third set of contact pads of the plurality of contact pads is respectively electrically connected to the control region of the corresponding select transistors, so that each select transistor of the plurality of select transistors is unambiguously assigned to respectively three contact pads of the plurality of contact pads and each test structure element of the plurality of test structure elements can be individually addressed by the plurality of contact pads.

According to various embodiments, a method for manufacturing an integrated test circuit according may further include providing at least one common contact pad, wherein the at least one common contact pad is electrically connected to the corresponding at least one test line of each test structure element of the plurality of test structure elements.

According to various embodiments, an integrated test circuit may include an arrangement of $n_{max}$ times $m_{max}$ times $k_{max}$ test structure elements (TS), $m_{max}$, $n_{max}$, and $k_{max}$ may be natural numbers larger than one respectively, wherein each test structure element may be individually identified by a tuple (m, n, k) of three pointer variables m, n, and k, wherein m may be a natural number ranging from 1 to $m_{max}$, n may be a natural number ranging from 1 to $n_{max}$, and k may be a natural number ranging range from 1 to $k_{max}$, and wherein each test structure element may include at least a supply line and a test line; an arrangement of $m_{max}$ times $n_{max}$ pre-select transistors (PT), wherein each pre-select transistor may be identified by the tuple (m, n) of the two pointer variables m and n, and wherein each pre-select transistor may include a first controlled region, a second controlled region, and a control region; a plurality of select transistors T(m, n, k) arranged in $m_{max}$ times $n_{max}$ select transistor arrangements each including $k_{max}$ select transistors T(m, n, k), wherein the $k_{max}$ select transistors T(m, n, 1 to $k_{max}$) of a respective one-dimensional select transistor arrangement may be unambiguously assigned to the corresponding pre-select transistor PT(m, n), wherein each select transistor T(m, n, k) of the plurality of select transistors may be unambiguously assigned to a test structure element TS(m, n, k), and the assigned select transistor T(m, n, k) may be identified by the 3-tuple (m, n, k) of the three pointer variables m, n, and k, and wherein each select transistor T(m, n, k) of the plurality of select transistors T(m, n, k) may include a first controlled region, a second controlled region, and a control region; electrical connections, wherein the second controlled region of each pre-select transistor PT(m, n) may be respectively connected to the corresponding first controlled region of the $k_{max}$ select transistors T(m, n, 1 to $k_{max}$), and wherein the second controlled region of each select transistor T(m, n, k) may be respectively connected to the supply line of the corresponding test structure element TS(m, n, k); a plurality of contact pads (CP), wherein each contact pad of a first set of contact pads CP1(1 to $m_{max}$) of the plurality of contact pads CP may be respectively connected to the control region of the 1 to $n_{max}$ pre-select transistors PT(m, 1 to $n_{max}$), wherein each contact pad of a second set of contact pads CP2(1 to $n_{max}$) of the plurality of contact pads CP may be respectively connected to the first controlled region of the corresponding 1 to $m_{max}$ pre-select transistors PT(1 to $m_{max}$, n), wherein each contact pad of a third set of contact pads CP3(1 to $k_{max}$) of the plurality of contact pads CP may be respectively connected to the control region of the corresponding $m_{max}$ times $n_{max}$ select transistors T(1 to $m_{max}$, 1 to $n_{max}$, k), so that each select transistor T(m, n, k) may be unambiguously assigned to respectively three contact pads CP1(m), CP2(n) and CP3(k), such that each test structure element TS(m, n, k) may be individually addressed by the plurality of contact pads (CP).

According to various embodiments, an integrated test circuit may include an arrangement of $n_{max}$ times $n_{max}$ test structure elements (TS), $m_{max}$ and $n_{max}$ may be natural numbers larger than one respectively, wherein each test structure element may be individually identified by a tuple (m, n) of two pointer variables m and n, wherein m may be a natural number ranging from 1 to $m_{max}$ and n may be a natural number ranging from 1 to $n_{max}$, and wherein each test structure element may include at least a supply line and a test line; an arrangement of $m_{max}$ times $n_{max}$ select transistors (T), wherein each select transistor T(m, n) may be unambiguously assigned to one corresponding test structure element TS(m, n) and the assigned select transistor may be identified by the same tuple (m, n), and wherein each select transistor may include a first controlled region, a second controlled region, and a control region, wherein the second controlled region of each select transistor T(m,n) may be respectively connected to the supply line of the corresponding test structure element TS(m, n); and a plurality of contact pads contact pads (CP), wherein each contact pad of a first set of contact pads CP1(1 to $m_{max}$) of the plurality of contact pads CP may be respectively connected to the control region of the corresponding 1 to $n_{max}$ select transistors T(m, 1 to $n_{max}$), and wherein each contact pad of a second set of contact pads CP2(1 to $n_{max}$) of the plurality of contact pads CP may be respectively connected to the first controlled region of the corresponding 1 to $m_{max}$ select transistors T(1 to $m_{max}$, n), so that each select transistor T(m, n) may be unambiguously assigned to respectively two contact pads CP1(m) and CP2(n), such that each test structure element TS(m, n) may be individually addressed by the contact pads.

According to various embodiments, a method for manufacturing an integrated test circuit may include providing an arrangement of $m_{max}$ times $n_{max}$ test structure elements (TS), $m_{max}$ and $n_{max}$ may be natural numbers larger than one respectively, wherein each test structure element may be individually identified by a tuple (m, n) of two pointer variables m and n, wherein m may be a natural number ranging from 1 to $m_{max}$ and n may be a natural number ranging from 1 to $n_{max}$, and wherein each test structure element may include at least a supply line and a test line; providing an arrangement of $m_{max}$ times $n_{max}$ select transistors (T), wherein each select transistor T(m, n) may be unambiguously assigned to one corresponding test structure element TS(m, n) and the assigned select transistor may be identified by the same tuple (m, n), and wherein each select transistor may include a first controlled region, a second controlled region, and a control region, wherein the second controlled region of each select transistor T(m,n) may be respectively connected to the supply line of the corresponding test structure element TS(m, n); and providing a plurality of contact pads contact pads (CP), wherein each contact pad of a first set of contact pads CP1(1 to $m_{max}$) of the plurality of contact pads CP may be respectively connected to the control region of the corresponding 1 to $n_{max}$ select transistors T(m, 1 to $n_{max}$), and wherein each contact pad of a second set of contact pads CP2(1 to $n_{max}$) of the plurality of contact pads CP may be respectively connected to the first controlled region of the corresponding 1 to $m_{max}$ select transistors T(1 to $m_{max}$, n), so that each select transistor T(m, n) may be unambiguously assigned to respectively two contact pads CP1(m) and CP2(n), such that each test structure element TS(m, n) may be individually addressed by the contact pads.

According to various embodiments, a method for manufacturing an integrated test circuit may include providing an arrangement of $n_{max}$ times $m_{max}$ times $k_{max}$ test structure elements (TS), $m_{max}$, $n_{max}$, and $k_{max}$ may be natural numbers larger than one respectively, wherein each test structure element may be individually identified by a tuple (m, n, k) of three pointer variables m, n, and k, wherein m may be a natural number ranging from 1 to $m_{max}$, n may be a natural number ranging from 1 to $n_{max}$, and k may be a natural number ranging range from 1 to $k_{max}$, and wherein each test structure element may include at least a supply line and a test line; providing an arrangement of $m_{max}$ times $n_{max}$ pre-select transistors (PT), wherein each pre-select transistor may be identified by the tuple (m, n) of the two pointer variables m and n, and wherein each pre-select transistor may include a first controlled region, a second controlled region, and a control region; providing a plurality of select transistors T(m, n, k) arranged in $m_{max}$ times $n_{max}$ select transistor arrangements each including $k_{max}$ select transistors T(m, n, k), wherein the $k_{max}$ select transistors T(m, n, 1 to $k_{max}$) of a respective one-dimensional select transistor arrangement may be unambiguously assigned to the corresponding pre-select transistor PT(m, n), wherein each select transistor T(m, n, k) of the plurality of select transistors may be unambiguously assigned to a test structure element TS(m, n, k), and the assigned select transistor T(m, n, k) may be identified by the 3-tuple (m, n, k) of the three pointer variables m, n, and k, and wherein each select transistor T(m, n, k) of the plurality of select transistors T(m, n, k) may include a first controlled region, a second controlled region, and a control region; providing electrical connections, wherein the second controlled region of each pre-select transistor PT(m, n) may be respectively connected to the corresponding first controlled region of the $k_{max}$ select transistors T(m, n, 1 to $k_{max}$), and wherein the second controlled region of each select transistor T(m, n, k) may be respectively connected to the supply line of the corresponding test structure element TS(m, n, k); providing a plurality contact pads (CP), wherein each contact pad of a first set of contact pads CP1(1 to $m_{max}$) of the plurality of contact pads CP may be respectively connected to the control region of the 1 to $n_{max}$ pre-select transistors PT(m, 1 to $n_{max}$), wherein each contact pad of a second set of contact pads CP2(1 to $n_{max}$) of the plurality of contact pads CP may be respectively connected to the first controlled region of the corresponding 1 to $m_{max}$ pre-select transistors PT(1 to $m_{max}$, n), wherein each contact pad of a third set of contact pads CP3(1 to $k_{max}$) of the plurality of contact pads CP may be respectively connected to the control region of the corresponding $m_{max}$ times $n_{max}$ select transistors T(1 to $m_{max}$, 1 to $n_{max}$, k), so that each select transistor T(m, n, k) may be unambiguously assigned to respectively three contact pads CP1(m), CP2(n) and CP3(k), such that each test structure element TS(m, n, k) may be individually addressed by the plurality of contact pads (CP).

According to various embodiments, a method for manufacturing an integrated test circuit may further include providing a common contact pad, wherein the common contact pad may be electrically connected to the test line of each test structure of the plurality of test structure elements.

According to various embodiments, the first controlled region of a transistor (e.g. the select transistor, e.g. the pre-select transistor, as described herein) may be a first source/drain region, e.g. a source region, of a transistor (e.g. a field effect transistor, a MOSFET, a FinFET, and the like), the second controlled region of a transistor (e.g. the select transistor, e.g. the pre-select transistor, as described herein) may be a second source/drain region, e.g. a drain region, of a transistor (e.g. a field effect transistor, a MOSFET, a FinFET, and the like), and the control region of a transistor (e.g. the select transistor, e.g. the pre-select transistor, as described herein) may be the control gate of a transistor (e.g. a field effect transistor, a MOSFET, a FinFET, and the like).

According to various embodiments, there may be a difference between the logical illustration of the layout (the arrangement of the various structure elements and electrical connections included in an integrated test circuit) with reference to the figures as shown herein, and the physical layout, which may be adapted to the specific needs for example during the fabrication of the integrated test circuit.

According to various embodiments, the electrical connections between the structure elements (e.g. test structure elements, select transistors, contact pads, and the like) are indicated in the figures included herein as usual with black lines. Further, electrical junctions are indicated in the figures included herein as usual with black dots. It has to be noted, that crossing electrical connections (crossing black lines) are not electrically connected to each other, if there is no electrical junction (black dot) at the crossing point.

According to various embodiments, a test structure element may also include more than one sub test structure element, e.g. a test structure element 104, 518 may include a plurality of sub test structure elements (e.g. a plurality of test vias, test transistors, test comb lines, test snakes, or test contact chains). According to various embodiments, the test lines of the test structure elements may be connected to a plurality of contact pads. According to various embodiments, the logical illustration of the layout may also be extended to more than three dimensions, which may lead to a more efficient n-dimensional arrangement of test structure elements, in analogy to the principles as shown herein in the exemplary two-dimensional arrangement and three-dimensional arrangement of test structure elements.

According to various embodiments, a three-dimensional test structure element arrangement (e.g. three-dimensional test structure arrangement 502) may need more space in the kerf regions of a wafer, but not necessarily an additional metallization layer. Regarding to this, the necessary space may be provided in the kerf region of a wafer, since the transistors (e.g. the select transistors, e.g. preselect transistors) together with the necessary metallization for the transistors may be significantly smaller than the dimensions of the test structure element arrangement.

According to various embodiments, the select transistors may control the current flow in the test structure elements. According to various embodiments, the select transistors may be not necessarily optimized to the smallest possible feature size. According to various embodiments the select transistors as well as pre-select transistors may allow a high current flow. According to various embodiments, using an arrangement of test structure elements, as described herein, may enable that the test structure elements may be electrically characterized individually, optionally and repeatedly. The selection of the transistors may be performed using a test program.

According to various embodiments, the current may flow from a contact pad of the second set of contact pads (e.g. contact pads CP2(1 to $n_{max}$)) via the corresponding select transistor (or through the corresponding select transistor and the corresponding pre-select transistor) through the corresponding test structure element to the common contact pad. According to various embodiments, the number of necessary contact pads may be reduced from n*m+1 to n+m+1 or from n*m*k+1 to n+m+k+1. As for example, using four different test structure elements (n=4) in six metallization layers (m=6) and three different feature sizes (k=3) may result in 14 necessary contact pads instead of 73 contact pads. For manufacturing the select transistors (or additionally the pre-select transistors), according to various embodiments, transistors may be used, which may be used on a chip anyway to realize high current flows. Regarding to this, additional metallization layers may be not necessary. According to various embodiments, transistors may be used having a small internal resistance.

According to various embodiments, at least one of the test structure 102, the two-dimensional select transistor arrangement 202, the arrangement 302, the test structure arrangements 402a, 402b, 402c, 402d, and the three-dimensional test structure arrangement 502, as shown and described herein, may be at least part of an integrated test circuit or at least part of a chip.

According to various embodiments, a plurality of contact pads may be included in an integrated test circuit (e.g. in test structure arrangement 402c and 402d), wherein the plurality of contact pads may include at least a first set of contact pads (e.g. contact pads CP1(1 to $m_{max}$), as shown in FIG. 4A to 4D) and a second set of contact pads (e.g. contact pads CP2(1 to $n_{max}$), as shown in FIG. 4A to 4D). According to various embodiments, a plurality of contact pads may be included into an integrated test circuit (e.g. into the three-dimensional test structure arrangement 502), wherein the plurality of contact pads may include at least a first set of contact pads (e.g. contact pads CP1(1 to $m_{max}$) of the three-dimensional test structure arrangement 502), a second set of contact pads (e.g. contact pads CP2(1 to $n_{max}$) of the three-dimensional test structure arrangement 502), and a third set of contact pads (e.g. contact pads CP3(1 to $k_{max}$) of the three-dimensional test structure arrangement 502). According to various embodiments, a three-dimensional test structure arrangement including a plurality of common contact pads (not shown in figures) may have a similar or the same arrangement of common contact pads as shown and described referring to the test structure arrangements 402c and 402d shown in FIGS. 4C and 4D.

According to various embodiments, a connection or an electrical connection may form a conductive path from one structure element to another structure element. According to various embodiments, connecting or electrically connecting at least two structure elements within an integrated test circuit may include providing a conductive path between the at least two structure elements.

According to various embodiments, providing a structure element within an integrated test circuit (e.g. providing a select transistor, e.g. providing a test structure element, e.g. providing a contact pad, e.g. providing a pre-select transistor, e.g. providing electrical connections) may include commonly used methods of semiconductor processing, such as layering, patterning, ion implantation (doping), cleaning, and the like.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated test circuit, comprising:
   a plurality of test structure elements, wherein each test structure element of the plurality of test structure elements comprises at least one supply line and at least one test line;
   a plurality of select transistors, wherein each select transistor of the plurality of select transistors is assigned to one corresponding test structure element, and wherein each select transistor of the plurality of select transistors comprises a first controlled region, a second controlled region, and a control region, wherein the second controlled region of each select transistor of the plurality of select transistors is respectively electrically connected to the supply line of the corresponding test structure element, so that each select transistor is unambiguously assigned to the corresponding test structure element;
   a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads of the plurality of contact pads and each test structure element of the plurality of test structure elements can be individually addressed by the plurality of contact pads,
   wherein at least one test structure element of the plurality of test structure elements comprises at least one of a via, a contact chain, a meander structure, and a comb line.

2. The integrated test circuit of claim 1,
   wherein each test structure element of the plurality of test structure elements can be individually addressed by respectively two contact pads of the plurality of contact pads, wherein one contact pad is of the first set of contact pads and the other contact pad is of the second set of contact pads.

3. The integrated test circuit of claim 1, further comprising:
   at least one common contact pad, wherein the at least one common contact pad is electrically connected to the corresponding at least one test line of each test structure element of the plurality of test structure elements.

4. The integrated test circuit of claim 3,
   wherein a total number of contact pads, including the plurality of contact pads and one common contact pad, is $n_{max}+m_{max}+1$ and the total number of test structure elements is $n_{max}$ times $m_{max}$, wherein $m_{max}$ and $n_{max}$ are natural numbers larger than one respectively.

5. The integrated test circuit of claim 1,
   wherein the total number of test structure elements is equal to the total number of select transistors.

6. The integrated test circuit of claim 1,
   wherein the integrated test circuit is at least part of a chip.

7. The integrated test circuit of claim 1,
   wherein the integrated test circuit is formed at least in a kerf region of a wafer.

8. The integrated test circuit of claim 1,
   wherein the plurality of select transistors is integrated at least one of over and in a main processing surface of a wafer, wherein the plurality of select transistors is arranged below the test structure elements.

9. The integrated test circuit of claim 1,
   wherein at least one select transistor of the plurality of select transistors is configured as a field effect transistor.

10. The integrated test circuit of claim 1,
    wherein at least one select transistor of the plurality of select transistors is configured as a bipolar transistor.

11. The integrated test circuit of claim 1,
    wherein the total number of contact pads in the plurality of contact pads is smaller than the total number of individually addressable select transistors.

12. The integrated test circuit of claim 1,
    wherein the current supply or voltage supply for each test structure element is respectively provided via the first controlled region and the second controlled region of the corresponding select transistor of the plurality of select transistors, wherein the corresponding select transistor is controlled via the corresponding contact pad which is electrically connected to the control region of the corresponding select transistor.

13. A method for manufacturing an integrated test circuit comprising:
    providing a plurality of test structure elements, wherein each test structure element of the plurality of test structure elements comprises at least one supply line and at least one test line and at least one of a via, a contact chain, a meander structure, and a comb line;
    providing a plurality of select transistors, wherein each select transistor of the plurality of select transistors is assigned to one corresponding test structure element, and wherein each select transistor comprises a first controlled region, a second controlled region, and a control region, wherein the second controlled region of each select transistor is respectively electrically connected to the supply line of the corresponding test structure element, so that each select transistor is unambiguous assigned to the corresponding test structure element;

providing a plurality of contact pads, wherein each contact pad of a first set of contact pads of the plurality of contact pads is respectively electrically connected to the control region of corresponding select transistors, and wherein each contact pad of a second set of contact pads of the plurality of contact pads is respectively electrically connected to the first controlled region of corresponding select transistors, so that each select transistor is unambiguously assigned to respectively two contact pads of the plurality of contact pads and each test structure element of the plurality of test structure elements can be individually addressed by the plurality of contact pads.

14. The method for manufacturing an integrated test circuit according to claim 13, further comprising:

providing at least one common contact pad, wherein the at least one common contact pad is electrically connected to the corresponding at least one test line of each test structure element of the plurality of test structure elements.

15. An integrated test circuit, comprising:

a plurality of test structure elements, wherein each test structure element of the plurality of test structure elements comprises at least one supply line and at least one test line;

a plurality of pre-select transistors, wherein each pre-select transistor of the plurality of pre-select transistors comprises at least a first controlled region, a second controlled region, and a control region;

a select structure comprising a plurality of select transistor arrangements, wherein each select transistor arrangement comprises a plurality of select transistors, wherein each select transistor arrangement of the plurality of select transistor arrangements is unambiguously assigned to one corresponding pre-select transistor, and wherein each select transistor of the select structure is clearly unambiguously assigned to one test structure element, wherein each select transistor of the select structure comprises a first controlled region, a second controlled region, and a control region;

a plurality of electrical connections, wherein the second controlled region of each of the pre-select transistors is respectively electrically connected to the corresponding first controlled region of the plurality of select transistors of the corresponding select transistor arrangement, and wherein the second controlled region of each select transistor of the plurality of select transistors is respectively electrically connected to the supply line of the corresponding test structure element;

a plurality of contact pads, wherein each contact pad of a first set of contact pads of the plurality of contact pads is respectively electrically connected to the control region of the corresponding pre-select transistors, wherein each contact pad of a second set of contact pads of the plurality of contact pads is respectively electrically connected to the first controlled region of the corresponding pre-select transistors, wherein each contact pad of a third set of contact pads of the plurality of contact pads is respectively electrically connected to the control region of the corresponding select transistors, so that each select transistor of the plurality of select transistors is unambiguously assigned to respectively three contact pads of the plurality of contact pads and each test structure element of the plurality of test structure elements can be individually addressed by the plurality of contact pads.

16. The integrated test circuit of claim 15, wherein each test structure element of the plurality of test structure elements can be individually addressed by three contact pads, wherein one contact pad is of the first set of contact pads, one contact pad is of the second set of contact pads, and one contact pad is of the third set of contact pads.

17. The integrated test circuit of claim 15, further comprising:

at least one common contact pad, wherein the at least one common contact pad is electrically connected to the corresponding at least one test line of each test structure element of the plurality of test structure elements.

18. The integrated test circuit of claim 17, wherein a total number of contact pads, including the plurality of contact pads and one common contact pad, is $m_{max}+n_{max}+k_{max}+1$ and the total number of test structure elements is $m_{max}$ times $n_{max}$ times $k_{max}$, wherein $m_{max}$, $n_{max}$, and $k_{max}$ are natural numbers larger than one respectively.

19. The integrated test circuit of claim 15, wherein the total number of test structure elements is equal to the total number of select transistors.

20. The integrated test circuit of claim 15, wherein the total number of contact pads is smaller than the total number of addressable test structure elements.

21. The integrated test circuit of claim 15, wherein the plurality of select transistors and the plurality of pre-select transistors are integrated at least one of over and in a main processing surface of the wafer, wherein the plurality of select transistors and the plurality of pre-select transistors are arranged below the test structure elements.

22. The integrated test circuit of claim 15, wherein at least one pre-select transistor is configured as a field effect transistor.

23. A method for manufacturing an integrated test circuit comprising:

providing a plurality of test structure elements, wherein each test structure element of the plurality of test structure elements comprises at least one supply line and at least one test line;

providing a plurality of pre-select transistors, wherein each pre-select transistor of the plurality of pre-select transistors comprises at least a first controlled region, a second controlled region, and a control region;

providing a select structure comprising a plurality of select transistor arrangements, wherein each select transistor arrangement comprises a plurality of select transistors, wherein each select transistor arrangement of the plurality of select transistor arrangements is unambiguously assigned to one corresponding pre-select transistor, and wherein each select transistor of the select structure is clearly unambiguously assigned to one test structure element, wherein each select transistor of the select structure comprises a first controlled region, a second controlled region, and a control region;

providing a plurality of electrical connections, wherein the second controlled region of each of the pre-select transistors is respectively electrically connected to the corresponding first controlled region of the plurality of select transistors of the corresponding select transistor arrangement, and wherein the second controlled region of each select transistor of the plurality of select transistors is respectively electrically connected to the supply line of the corresponding test structure element;

providing a plurality of contact pads, wherein each contact pad of a first set of contact pads of the plurality of contact pads is respectively electrically connected to the control region of the corresponding pre-select transistors, wherein each contact pad of a second set of contact pads of the plurality of contact pads is respectively electrically connected to the first controlled region of the corresponding pre-select transistors, wherein each contact pad of a third set of contact pads of the plurality of contact pads is respectively electrically connected to the control region of the corresponding select transistors, so that each select transistor of the plurality of select transistors is unambiguously assigned to respectively three contact pads of the plurality of contact pads and each test structure element of the plurality of test structure elements can be individually addressed by the plurality of contact pads.

24. The method for manufacturing an integrated test circuit according to claim 23, further comprising:
providing at least one common contact pad, wherein the at least one common contact pad is electrically connected to the corresponding at least one test line of each test structure element of the plurality of test structure elements.

* * * * *